(12) United States Patent
Peng et al.

(10) Patent No.: US 11,309,398 B2
(45) Date of Patent: Apr. 19, 2022

(54) SEMICONDUCTOR DEVICE AND MANUFACTURING METHOD FOR THE SEMICONDUCTOR DEVICE

(71) Applicant: TAIWAN SEMICONDUCTOR MANUFACTURING COMPANY LTD., Hsinchu (TW)

(72) Inventors: Chun-Yen Peng, Hsinchu (TW); Te-Yang Lai, Hsinchu (TW); Bo-Feng Young, Taipei (TW); Chih-Yu Chang, New Taipei (TW); Sai-Hooi Yeong, Hsinchu County (TW); Chi On Chui, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 38 days.

(21) Appl. No.: 16/837,932

(22) Filed: Apr. 1, 2020

(65) Prior Publication Data

US 2021/0313440 A1 Oct. 7, 2021

(51) Int. Cl.
*H01L 29/51* (2006.01)
*H01L 29/78* (2006.01)
*H01L 29/66* (2006.01)
*H01L 21/28* (2006.01)
*H01L 21/02* (2006.01)

(52) U.S. Cl.
CPC ...... *H01L 29/516* (2013.01); *H01L 21/02356* (2013.01); *H01L 21/28185* (2013.01); *H01L 29/513* (2013.01); *H01L 29/66545* (2013.01); *H01L 29/66795* (2013.01); *H01L 29/7851* (2013.01)

(58) Field of Classification Search
CPC ... H01L 23/528; H01L 21/311; H01L 27/108; H01L 21/76; H01L 21/0332; H01L 21/32139; H01L 21/31116
See application file for complete search history.

(56) References Cited

U.S. PATENT DOCUMENTS

| | | | | |
|---|---|---|---|---|
| 2009/0261395 | A1* | 10/2009 | Boescke | H01L 21/02181 257/295 |
| 2016/0071934 | A1* | 3/2016 | Cea | H01L 29/66545 257/192 |
| 2018/0083141 | A1* | 3/2018 | Chen | H01L 29/4966 |
| 2019/0207009 | A1* | 7/2019 | Yamaguchi | H01L 21/823462 |
| 2019/0312108 | A1* | 10/2019 | Li | H01L 27/24 |
| 2020/0013897 | A1* | 1/2020 | Park | H01L 29/516 |

(Continued)

OTHER PUBLICATIONS

H. Zhu et al., Increasing energy storage capabilities of space-charge dominated ferroelectric thin films using interlayer coupling, Acta Materialia 122 (2017) 252-258.

(Continued)

*Primary Examiner* — Telly D Green
*Assistant Examiner* — Andre C Stevenson
(74) *Attorney, Agent, or Firm* — WPAT, P.C., Intellectual Property Attorneys; Anthony King

(57) ABSTRACT

The present disclosure provides a semiconductor device, including a substrate, a fin over the substrate, a multilayer gate dielectric stack over the fin, wherein the multilayer gate dielectric stack includes a first ferroelectric layer, and a first dielectric layer coupled to the first ferroelectric layer, and a gate over the multilayer gate dielectric stack.

20 Claims, 30 Drawing Sheets

(56) References Cited

U.S. PATENT DOCUMENTS

2020/0152741 A1* 5/2020 Li .................... H01L 29/78696
2020/0212224 A1* 7/2020 Penumatcha ..... H01L 29/41725
2020/0286984 A1* 9/2020 Chang ............... H01L 27/10814
2020/0312950 A1* 10/2020 Haratipour .......... H01L 23/5226

OTHER PUBLICATIONS

Ho Nyung Lee et al., Strong polarization enhancement in asymmetric three-component ferroelectric superlattices, Nature vol. 433, Jan. 27, 2005, 395-399, 792.
F. C. Sun et al., Are ferroelectric multilayers capacitors in series?, J Mater Sci (2016) 51:499-505.
Y. Zhou, Enhancement of dielectric and ferroelectric properties in ferroelectric superlattices, Solid State Communications 150 (2010) 1382-1385.
Sai-Hooi Yeong, et al.(Taiwan Semiconductor Manufacturing Company), U.S. Appl. No. 16/236,225.

* cited by examiner

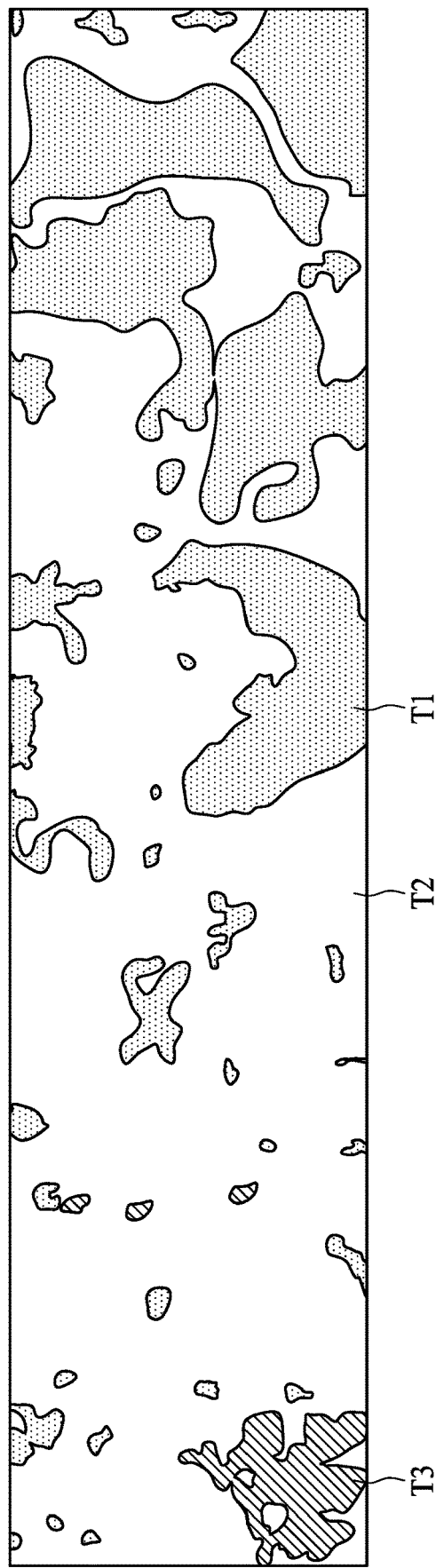

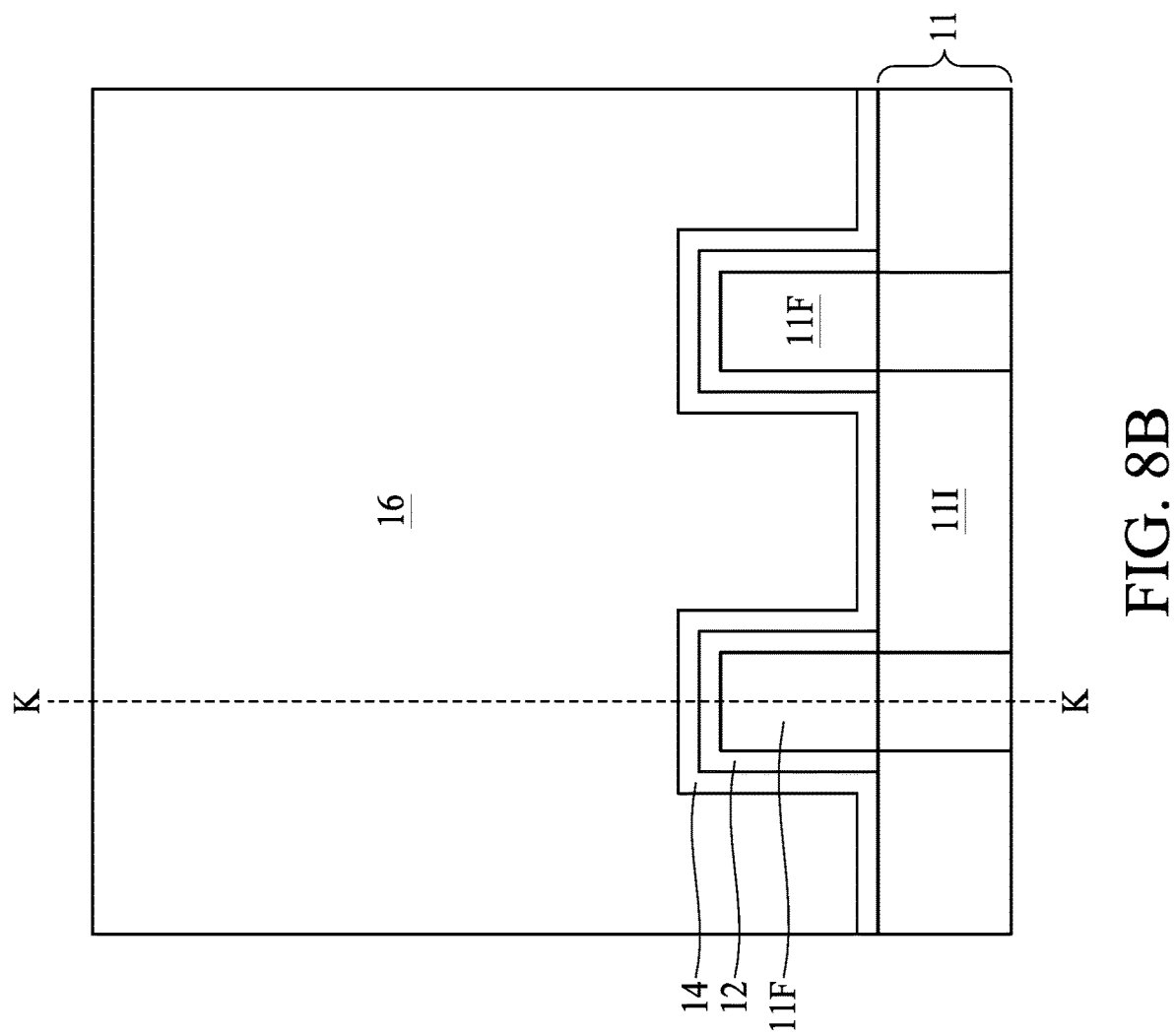

SEMICONDUCTOR DEVICE AND MANUFACTURING METHOD FOR THE SEMICONDUCTOR DEVICE

BACKGROUND

The semiconductor integrated circuit (IC) industry has experienced exponential growth. Technology advances in IC materials and design have produced generations of ICs where each generation has smaller and more complex circuits. In order to scale devices to smaller nodes, high k materials may be used in the gate stack. For example, an interfacial layer (IL) over a channel region and a high k layer over the interfacial layer. The combination of the interfacial layer and the high k layer have an equivalent oxide thickness (EOT), wherein EOT is the thickness of a silicon oxide layer that would have the same effect as the combination of the interfacial layer and the high k layer. Generally, greater EOT leads to less inversion charge, thus limiting the performance of the device.

However, on the other hand, scaling down EOT may face several issues, such as causing greater gate leakage current, causing higher interface trap, degrading mobility and/or deteriorating reliability. Alleviating the issues resulting from EOT scaling is entailed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 3A is a cross sectional view of a ferroelectric layer of a semiconductor structure showing microstructure of the ferroelectric layer, according to some embodiments of the present disclosure.

FIG. 8B is a schematic drawing illustrating a cross sectional view taken along line J-J of FIG. 8A, according to some embodiments of the present disclosure.

DETAILED DESCRIPTION

Figure 1A:
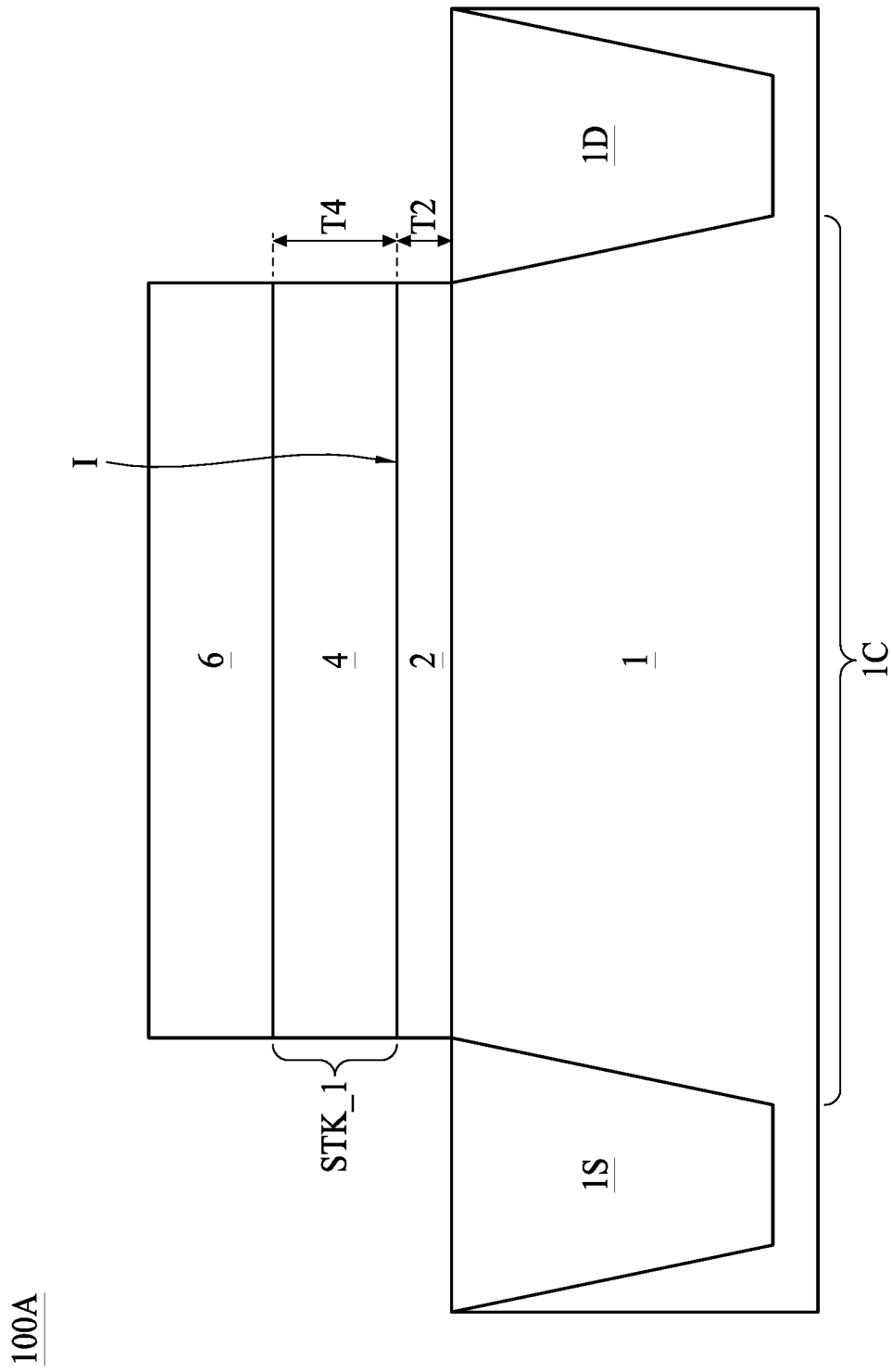
FIG. 1A is a cross sectional view of a semiconductor device, according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the terms "substantially," "approximately," or "about" generally means within a value or range which can be contemplated by people having ordinary skill in the art. Alternatively, the terms "substantially," "approximately," or "about" means within an acceptable standard error of the mean when considered by one of ordinary skill in the art. People having ordinary skill in the art can understand that the acceptable standard error may vary according to different technologies. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "substantially," "approximately," or "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

The present disclosure provides semiconductor devices and method of fabricating semiconductor devices. Specifically, in order to scale down the equivalent oxide thickness (EOT) of a gate layer of a device and alleviate the issues stems therefrom, a ferroelectric layer can be utilized in a gate dielectric stack of a device. Some of the ferroelectric materials may behave as a high-k dielectric layer that can be utilized in gate dielectric stack.

Furthermore, by using a combination of ferroelectric layers coupled with dielectric layers as a gate dielectric stack between a gate and a channel region, the equivalent dielectric constant (k) of such gate dielectric stack can be even higher comparing to ordinary high-k gate dielectric layer with same thickness. A greater equivalent dielectric constant may reduce required power and alleviate direct-tunneling current issues.

In the present disclosure, the term "ferroelectricity" can be referred to a characteristic of certain materials that have a spontaneous electric polarization that can be altered or reversed by the application of an external electric field.

Referring to FIG. 1A, FIG. 1A is a cross sectional view of a semiconductor device, according to some embodiments of the present disclosure. A semiconductor device 100A includes a substrate 1, wherein the substrate 1 includes a source region 1S, a drain region 1D, and a channel region 1C defined by the source region 1S and the drain region 1D (i.e. between the source region 1S and the drain region 1D). In some embodiments, the substrate 1 includes a bulk semiconductor material, such as silicon, germanium, silicon germanium, silicon carbide, III-V compounds (such as GaAs, InGaAs, GaN, et cetera), transition metal dichalcogenide (TMD) materials ($MoS_2$, $WS_2$, $MoSe_2$, $WSe_2$, $MoTe_2$, et cetera), carbon material (such as carbon nanotube (CNT), graphene, et cetera), or other suitable materials to be utilized as semiconductor substrate. A gate dielectric stack STK_1 is above the channel region 1C, and a gate 6 is above the gate dielectric stack STK_1. In some embodiments, a material of the gate 6 includes metal.

The gate dielectric stack STK_1 includes a ferroelectric layer 4 having a characteristic of ferroelectricity. The ferroelectric layer 4 may include a ferroelectric-phase high-k material having a polarization and high-k, such as pure $HfO_2$, $ZrO_2$, $HfZrO_x$ alloy, or one of the $HfO_2$, $ZrO_2$, $HfZrO_x$ doped with a dopant such as lanthanum (La), silicon (Si), nitride (N), yttrium (Y), gadolinium (Gd). The aforesaid dopants may help improving the ferroelectricity or anti-ferroelectricity of the material by altering an crystallization or electrical characterization. Alternatively, anti-ferroelectric-phase high-k material or field-induced ferroelectric-phase high-k material can also be a material of the ferroelectric layer 4. In some embodiments, the material of the ferroelectric layer 4 is partially or entirely crystalized (i.e. at least includes crystal grains), wherein the crystalline phase of such material may be orthorhombic, tetragonal, cubic, or distorted monoclinic, or alternatively, nanocrystalline, polycrystalline, or epitaxy. The aforesaid material may show adequate ferroelectricity or anti-ferroelectricity, which has a polarization. In some embodiments, a thickness T4 of the ferroelectric layer 4 is from about 10 Angstrom to about 50 Angstrom.

In some embodiments, an interfacial layer 2 is between the ferroelectric layer 4 and the channel region 1C of the substrate 1. The interfacial layer 2 includes a non-polarization material, such as interfacial dielectric, high-k material, oxide materials such as $SiO_x$, $GeO_x$, $SiGeO_x$, $AlO_x$, $YO_x$, $AlGeO_x$, $YGeO_x$, hafnium-based materials such as $HfO_x$, HfON, $HfSiO_x$, HfSiON, or the like. In some embodiments, a material of the interfacial layer 2 is amorphous, nanocrystalline, polycrystalline, or epitaxy. In the case of the interfacial layer 2 including hafnium oxide ($HfO_2$)-based materials, the material of the interfacial layer 2 is amorphous or monoclinic. In some embodiments, a thickness T2 of the interfacial layer 2 is from about 1 Angstrom to about 50 Angstrom. When the interfacial layer 2 is greater than 50 Angstrom, the performance of the semiconductor device 100A may be limited due to less inversion charge; when the interfacial layer 2 is less than 1 Angstrom, the reliability of the semiconductor device 100A may be decreased due to greater leakage current or greater interface trap.

The ferroelectric layer 4 is coupled to the interfacial layer 2 at an interface I, wherein the ferroelectric layer 4 and the interfacial layer 2 have a polarization coupling due to coupling effect. Herein a component of electrical polarization of the ferroelectric layer 4 near the interface I is coupled to the interfacial layer 2, as the electric characteristic of the coupled layers in combination is altered. The combination of the ferroelectric layer 4 and the interfacial layer 2 may be utilized as a high-k dielectric layer, and has a dielectric constant (k) higher than a dielectric material having an identical thickness or a high-k material having an identical thickness. Alternatively stated, due to the coupling effect, the dielectric constant can be increased under similar spacing between gate 6 and substrate 1.

Such coupling effect enhance the dielectric constant and equivalent capacitance of the combination of the ferroelectric layer 4 and the interfacial layer 2. Such enhancement can be represented as (1) $1/\varepsilon_{total} < T2/\varepsilon_2 + T_{STK}/\varepsilon_{STK}$, wherein $\varepsilon_2$ is dielectric constant of the interfacial layer 2, $\varepsilon_{STK}$ is dielectric constant of the gate dielectric stack STK_1, $\varepsilon_{total}$ is dielectric constant of the combination of the interfacial layer 2 and the gate dielectric stack STK_1, $\varepsilon_{STK}$ is dielectric constant of the gate dielectric stack STK_1, $T_{STK}$ is a thickness of the gate dielectric stack STK_1; and (2) $1/C_{total} < T2/C_2 + T_{STK}/C_{STK}$, wherein $C_2$ is equivalent capacitance of the interfacial layer 2, $C_{STK}$ is equivalent capacitance of the gate dielectric stack STK_1, $C_{total}$ is dielectric constant of the combination of the interfacial layer 2 and the gate dielectric stack STK_1.

Figure 1B:
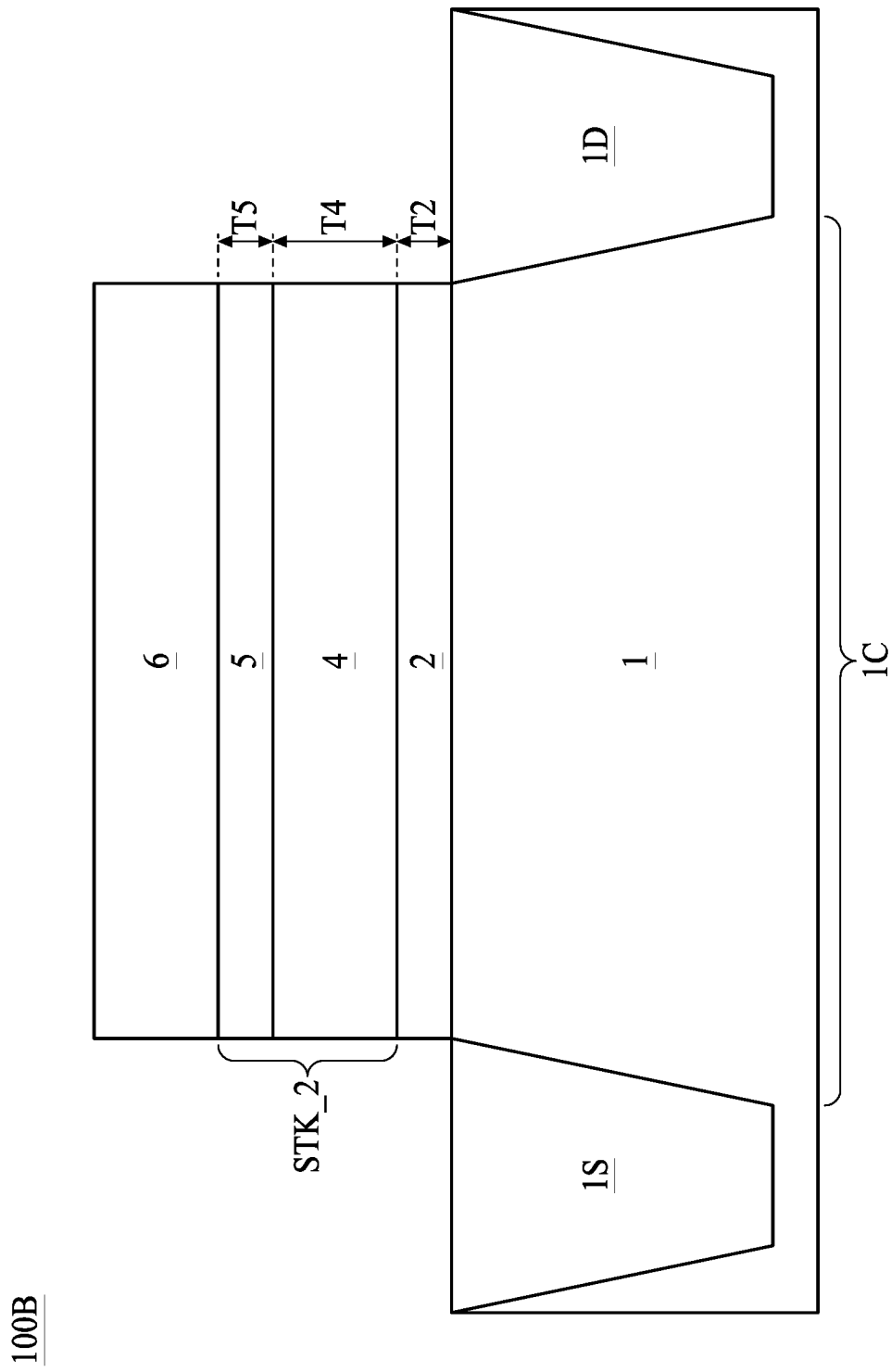
FIG. 1B is a cross sectional view of a semiconductor device, according to some embodiments of the present disclosure.

Referring to FIG. 1B, FIG. 1B is a cross sectional view of a semiconductor device, according to some embodiments of the present disclosure. A semiconductor device 100B is similar to the semiconductor device 100A discussed in FIG. 1A, but herein a multilayer gate dielectric stack STK_2 is disposed between the interfacial layer 2 and the gate 6. The multilayer gate dielectric stack STK_2 includes a ferroelectric layer 4 coupled to the interfacial layer 2 and a dielectric layer 5 coupled to and over the ferroelectric layer 4. The dielectric layer 5 includes a non-polarization material, such as interfacial dielectric, high-k material, oxide materials such as $SiO_x$, $GeO_x$, $SiGeO_x$, $AlO_x$, $YO_x$, $AlGeO_x$, $YGeO_x$, hafnium-based materials such as $HfO_x$, HfON, $HfSiO_x$, HfSiON, or the like. In some embodiments, a material of the dielectric layer 5 is amorphous, nanocrystalline, polycrystalline, or epitaxy. In the case of the dielectric layer 5 including hafnium oxide ($HfO_2$)-based materials, the material of the dielectric layer 5 is amorphous or monoclinic. In some embodiments, a thickness T5 of the dielectric layer 5 is from about 1 Angstrom to about 50 Angstrom. In some embodiments, a material of the dielectric layer 5 is different from a material of the interfacial layer 2.

By such configuration, the coupling effect may be effective between ferroelectric layer 4 and the interfacial layer 2, and between ferroelectric layer 4 and the dielectric layer 5. Therefore, the enhancement of dielectric constant can further be increased. It should be noted that, as previously discussed, the thickness of the interfacial layer 2 may be limited due to criticality relates to device performance. (i.e. when the interfacial layer 2 is greater than 50 Angstrom, the performance of the semiconductor device 100A may be limited due to less inversion charge; when the interfacial layer 2 is less than 1 Angstrom, the reliability of the semiconductor device 100A may be decreased due to greater leakage current or greater interface trap.) Furthermore, a space between the gate 6 and the substrate 1 may be limited under the consideration of design rule, node requirement, or configuration (for example, in a range from about 10 Angstrom to about 100 Angstrom), therefore, the thickness T2 of the interfacial layer 2 and the thickness T5 of the dielectric layer 5 can be adjusted under the consideration of the performance of the device (e.g. leakage current, inversion current, interface trap, etc.) while enhancing the coupling effect between interfaces between polarization layers and non-polarization layers. In some embodiments, a total of thickness T2 of the interfacial layer 2 and the thickness T5 of the dielectric layer 5 is in a range from about 3 Angstrom to about 50 Angstrom; and a ratio of a total of thickness T2 and thickness T5 over thickness T4 of the ferroelectric layer 4 is in a range from about 0.2 to about 5. Such configuration may increase dielectric constant of the multilayer gate dielectric stack STK_2 and the ferroelectric layer 4, alleviate leakage voltage, and decrease EOT while allowing the potential of scaling to smaller node technology.

Figure 1C:
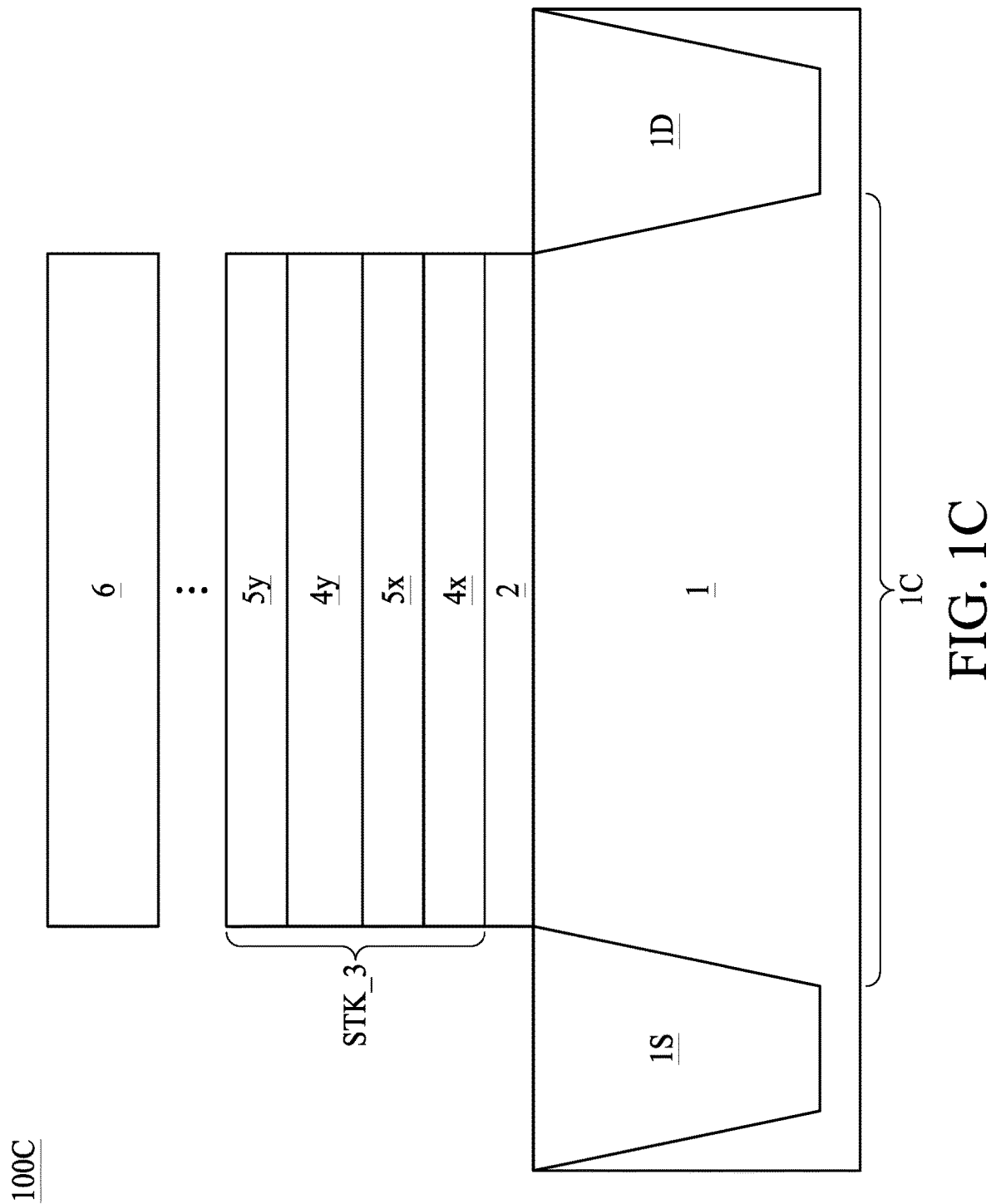
FIG. 1C is a cross sectional view of a semiconductor device, according to some embodiments of the present disclosure.

Referring to FIG. 1C, FIG. 1C is a cross sectional view of a semiconductor device, according to some embodiments of the present disclosure. A semiconductor device 100C is similar to the semiconductor device 100B discussed in FIG. 1B, but herein a multilayer gate dielectric stack STK_3 is disposed between the interfacial layer 2 and the gate 6. The multilayer gate dielectric stack STK_3 includes a plurality of ferroelectric layers (such as 4x, 4y . . . ) and a plurality of dielectric layers (such as 5x, 5y . . . ), wherein the ferroelectric layers and the dielectric layers are alternately stacked. Such configuration may further enhance the coupling effect since the coupling effect may take place at multiple interfaces between a dielectric layer and a ferroelectric layer, and an interface between the multilayer gate dielectric stack STK_3 and the interfacial layer 2.

As previously discussed, a space between the gate 6 and the substrate 1 may be limited under the consideration of design rule, node requirement, or configuration, and a thickness of thickness T2 of the interfacial layer 2 is limited. Thereby, each of the thickness of the dielectric layers (such as 5x, 5y . . . ) and the ferroelectric layers (such as 4x, 4y . . . ) can be adjusted under the consideration of the performance of the device (e.g. leakage current, inversion current, interface trap, etc.) while enhancing the coupling effect between interfaces between polarization layers and non-polarization layers. In some embodiments, a total thickness of each of the dielectric layers (such as 5x, 5y . . . ) is in a range from about 5 Angstrom to about 50 Angstrom. Such configuration may increase dielectric constant of the multilayer gate dielectric stack STK_3 and the ferroelectric layer 4, alleviate leakage voltage, and decrease EOT while allowing the potential of scaling to smaller node technology.

Figure 1D:
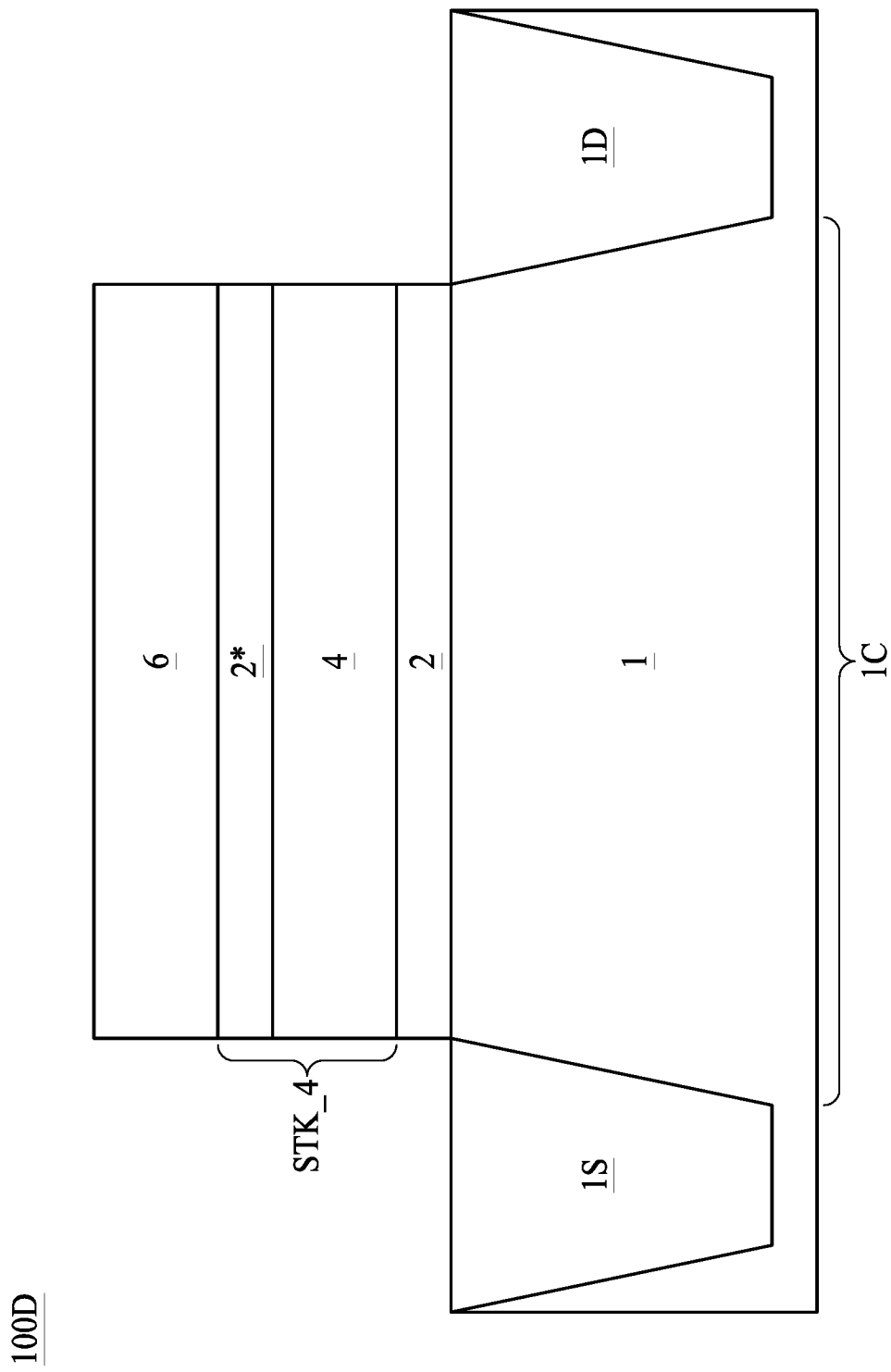
FIG. 1D is a cross sectional view of a semiconductor device, according to some embodiments of the present disclosure.

Referring to FIG. 1D, FIG. 1D is a cross sectional view of a semiconductor device, according to some embodiments of the present disclosure. A semiconductor device 100D is similar to the semiconductor device 100B discussed in FIG. 1B, but herein a multilayer gate dielectric stack STK_4 is disposed between the interfacial layer 2 and the gate 6. The multilayer gate dielectric stack STK_4 includes a ferroelectric layer 4 coupled to the interfacial layer 2 and another interfacial layer 2* coupled to and over the ferroelectric layer 4. Herein the interfacial layer 2* includes a material identical or similar to the interfacial layer 2. Such configuration may increase dielectric constant of the multilayer gate dielectric stack STK_4 and the ferroelectric layer 4, alleviate leakage voltage, and decrease EOT while allowing the potential of scaling to smaller node technology.

Figure 1E:
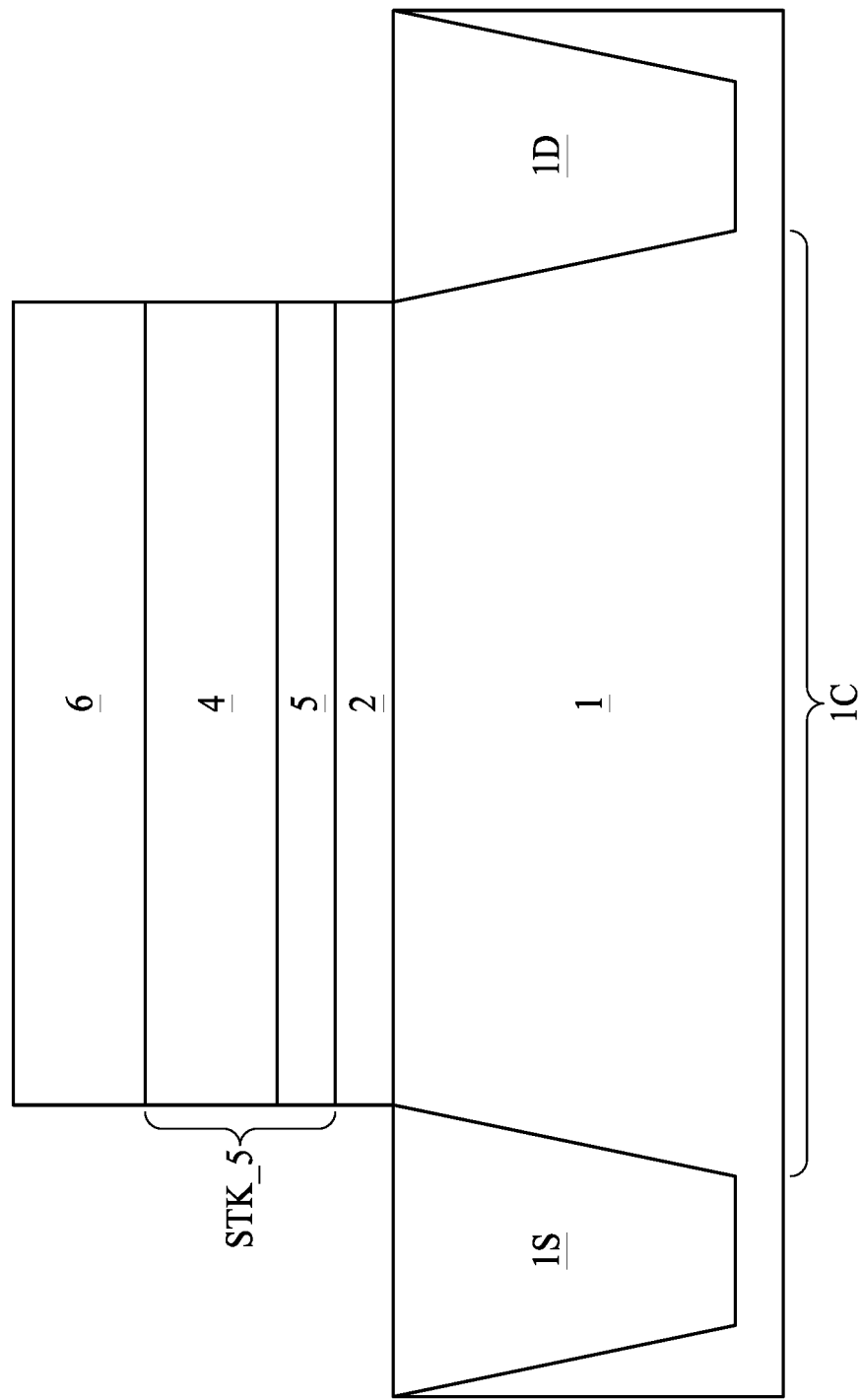
FIG. 1E is a cross sectional view of a semiconductor device, according to some embodiments of the present disclosure.

Referring to FIG. 1E, FIG. 1E is a cross sectional view of a semiconductor device, according to some embodiments of the present disclosure. A semiconductor device 100D is similar to the semiconductor device 100B discussed in FIG. 1B, but herein a multilayer gate dielectric stack STK_5 is disposed between the interfacial layer 2 and the gate 6. The multilayer gate dielectric stack STK_4 includes a dielectric layer 5 coupled to the interfacial layer 2 and a ferroelectric layer 4 coupled to and over the dielectric layer 5, wherein the gate 6 is over the ferroelectric layer 4. Herein a material of the dielectric layer 5 is different from a material of the interfacial layer 2, for example, may include different phases (as previously mentioned, amorphous, nanocrystalline, polycrystalline, or epitaxy) and/or include different type of dopants. In some embodiments, a dielectric constant of the interfacial layer 2 may be different from a dielectric constant of the dielectric layer 5. Such configuration may increase dielectric constant of the multilayer gate dielectric stack STK_5 and the ferroelectric layer 4, alleviate leakage voltage, and decrease EOT while allowing the potential of scaling to smaller node technology.

In order to enhance the coupling effect and addressing the issues of voltage leakage and EOT by incorporating the aforesaid gate dielectric stacks STK_1, STK_2, STK_3, STK_4, STK_5 discussed in FIG. 1A to FIG. 1E in semiconductor devices, the ferroelectric layer 4 (hereinafter including the ferroelectric layers 4x, 4y . . . discussed in FIG. 1C) includes specific composition, phase and/or dopant so that the ferroelectricity thereof can be enhanced and the such ferroelectric layers being applicable for the devices. The details will be discussed subsequently in FIG. 2A to FIG. 3B.

Figure 2A:
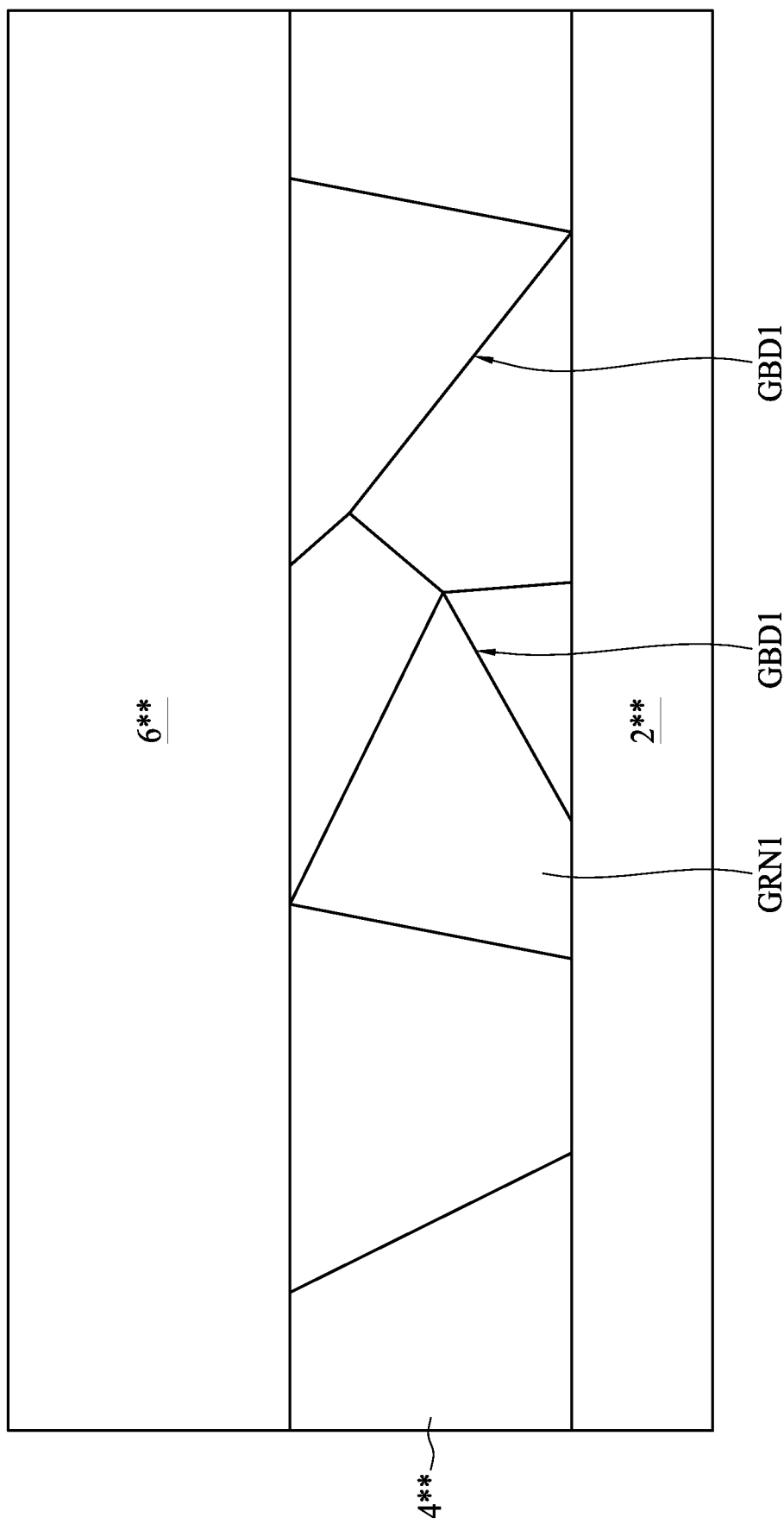
FIG. 2A is a partially enlarged cross sectional view of a ferroelectric layer of a semiconductor device, according to a comparative embodiment.

Referring to FIG. 2A, FIG. 2A is a partially enlarged cross sectional view of a ferroelectric layer of a semiconductor device, according to a comparative embodiment. In this comparative embodiment, a layer 4 is disposed between a gate 6 and an interfacial layer 2. The layer 4 includes grains GRN1 (for example, fully or near-fully crystallized grains) having grain boundaries GBD1 formed from the interfacial layer 2 to the gate 6. The grain boundaries GBD1 in fully or near-fully crystallized grains act as electrical leakage path, sources of crystalline defect generation, and/or oxidation path, thus the semiconductor device composed of such dielectric layer under the gate 6 may suffer leakage issues, oxidant issues, and excessive defects. Such layer 4 may not be able to alleviate leakage current while increasing dielectric constant, and may cause reliability issues.

Figure 2B:
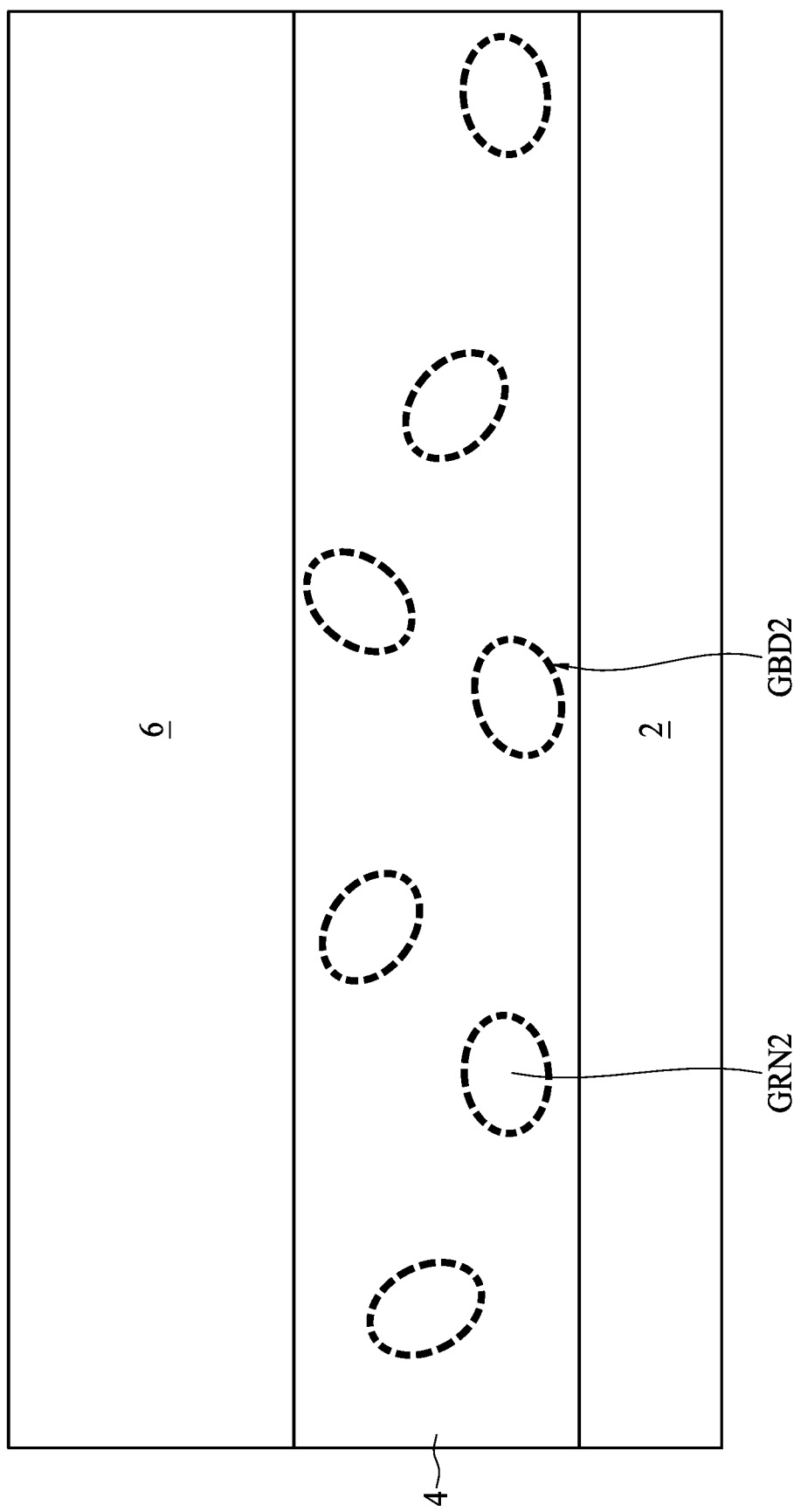
FIG. 2B is a partially enlarged cross sectional view of a ferroelectric layer of a semiconductor device, according to some embodiments of the present disclosure.

Referring to FIG. 2B, FIG. 2B is a partially enlarged cross sectional view of a ferroelectric layer of a semiconductor device, according to some embodiments of the present disclosure. In the case of the ferroelectric layer 4 discussed in gate dielectric stacks STK_1, STK_2, STK_3, STK_4, STK_5, at least a portion of the ferroelectric layer 4 is crystallized and the microstructure of such is different from that of fully or nearly-fully crystallized layer 4** previously discussed in FIG. 2A. For example, the ferroelectric layer 4 includes crystallized grains GRN2 having coherent boundaries GBD2 that surrounds the grains GRN2, as such interface between crystallized region and non-crystallized region (e.g. amorphous region) may be observable. Alternatively, the ferroelectric layer 4 may have materials having different phases, which may be observable through inspection methods, including but not limited to Transmission Electron Microscope (TEM), high-angle annular dark-field scanning (HAADF) TEM, convergent beam electron diffraction scanning (CBED) TEM, precession electron diffraction (PED) TEM, or selected area diffraction (SAD) TEM. By having boundaries surrounding the grains GRN2 in ferroelectric layer 4, the ferroelectric layer 4 may alleviate leakage current while providing a higher dielectric constant.

Figure 3B:
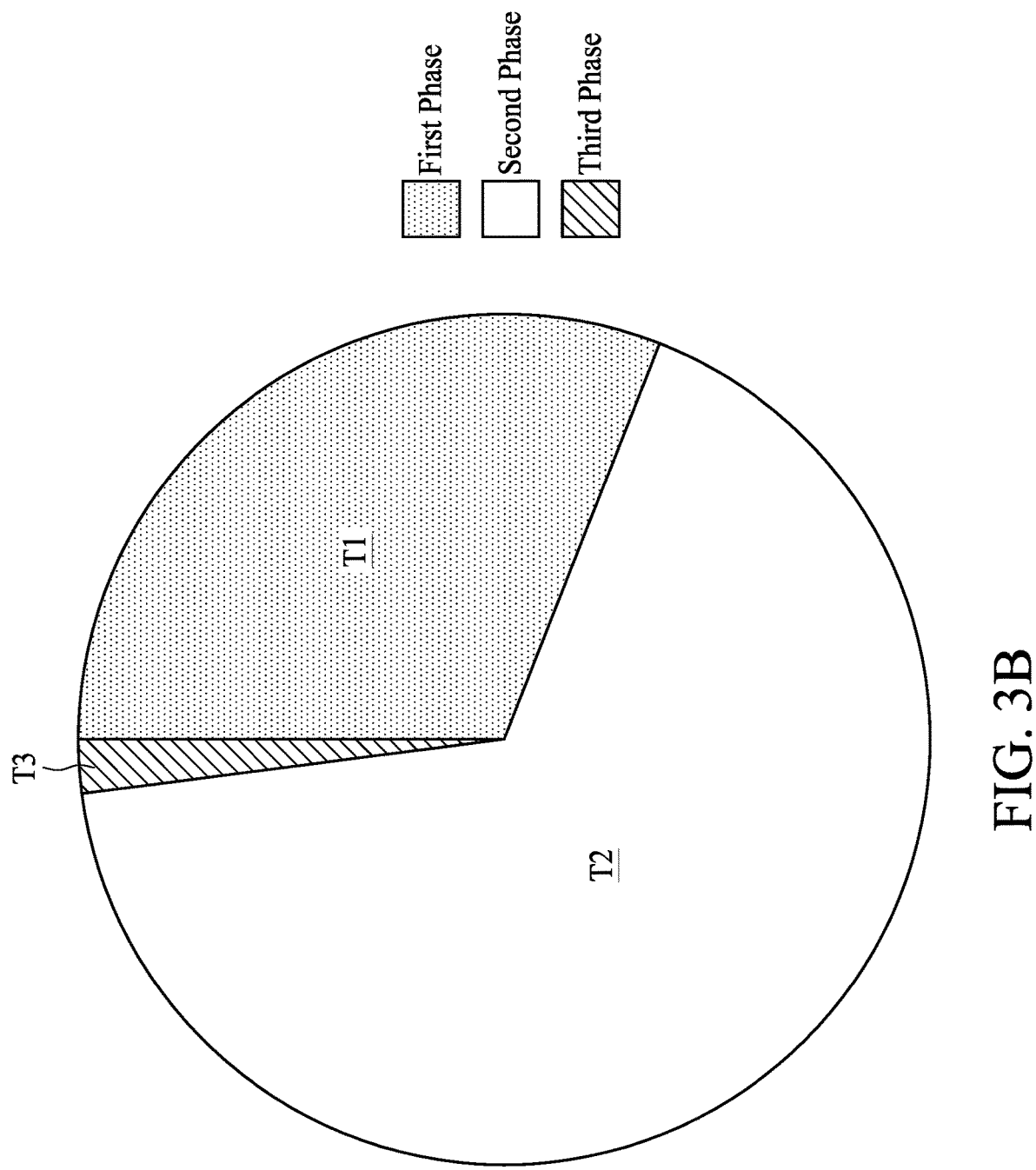
FIG. 3B is pie chart showing relative proportions of crystalline states in the ferroelectric layer of FIG. 3A, according to some embodiments of the present disclosure.

Referring to FIG. 3A and FIG. 3B, FIG. 3A is a cross sectional view of a ferroelectric layer of a semiconductor structure showing microstructure of the ferroelectric layer, and FIG. 3B is pie chart showing relative proportions of crystalline states in the ferroelectric layer of FIG. 3A, according to some embodiments of the present disclosure. Generally, a material may have various states presenting different crystalline structures, which may be represented by different Hermann-Mauguin notation. In some embodiments, in order to have a ferroelectric layer 4 with adequate/stronger ferroelectricity and dielectric constant, the ferroelectric layer 4 at least include a specific combination of phases of such material. In the case of ferroelectric layer 4 includes hafnium oxide ($HfO_2$)-based material, the hafnium oxide shows greater ferroelectricity in orthorhombic phase (e.g. Orthorhombic-29 $Pca2_1$), which is denoted as "the first phase T1" in FIG. 3A to FIG. 3B. Whereas other phases of hafnium oxide may show less or none ferroelectricity, for example, monoclinic phase (e.g. Monoclinic-14 $P2_1/c$) and tetragonal phase (e.g. Tetragonal-137 $P4_2/nmc$), respectively denoted as "the second phase T2" and "the third phase T3" in FIG. 3A to FIG. 3B.

The ferroelectric layer 4 may include a first portion of hafnium oxide-based material of first phase T1 (e.g. orthorhombic phase), a second portion of hafnium oxide-based material of second phase T2 (e.g. monoclinic phase), and a third portion of hafnium oxide-based material of third phase T3 (e.g. tetragonal phase). In order improve the ferroelectricity of the ferroelectric layer 4, the ferroelectric layer 4 at least include the hafnium oxide-based material of first phase T1, wherein the first phase T1 possess a certain proportion of volume in ferroelectric layer 4. In the example provided in FIG. 3B, each of the proportion of a volume of the first portion (the first phase T1), a volume of the second portion (the second phase T2) and the third portion (the third phase T3) among total volume of the ferroelectric layer 4 is about 31%, 67%, 2% (but the present disclosure is not limited thereto).

By utilizing the coupling effect, the aforesaid gate dielectric stacks STK_1, STK_2, STK_3, STK_4, STK_5 discussed in FIG. 1A to FIG. 1E, FIG. 2B to FIG. 3B may have enhanced dielectric constant and allowing the device to alleviate leakage voltage and/or decrease EOT while allowing the potential of scaling to smaller node technology. Such gate dielectric stacks STK_1, STK_2, STK_3, STK_4, STK_5 can be incorporated into a semiconductor device 200 (as will be discussed in FIG. 4A to FIG. 8B), a semiconductor device 300 (as will be discussed in FIG. 9A to FIG. 11G), or the like.

Figure 4A:
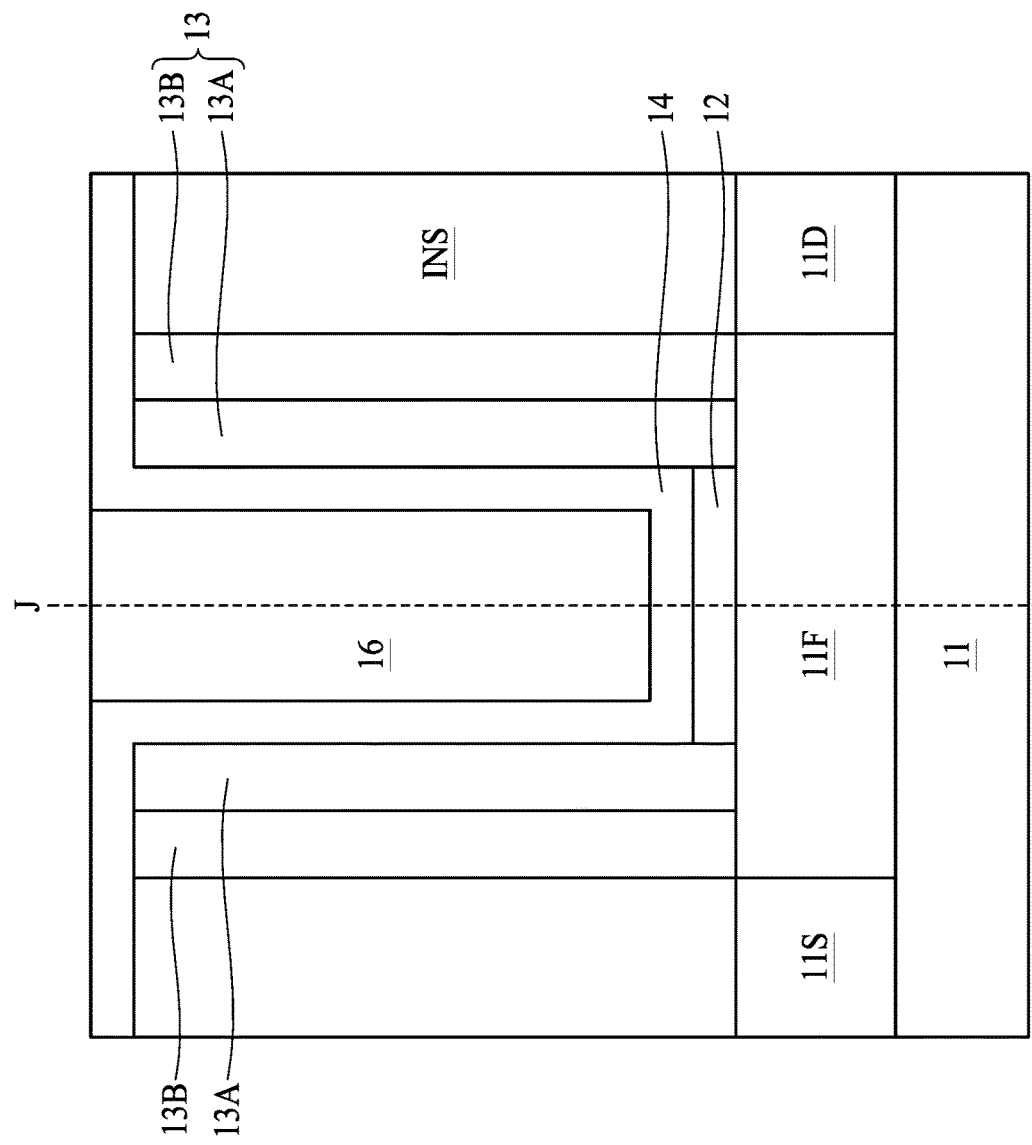
FIG. 4A is a cross sectional view of a semiconductor device, according to some embodiments of the present disclosure.
Figure 4B:
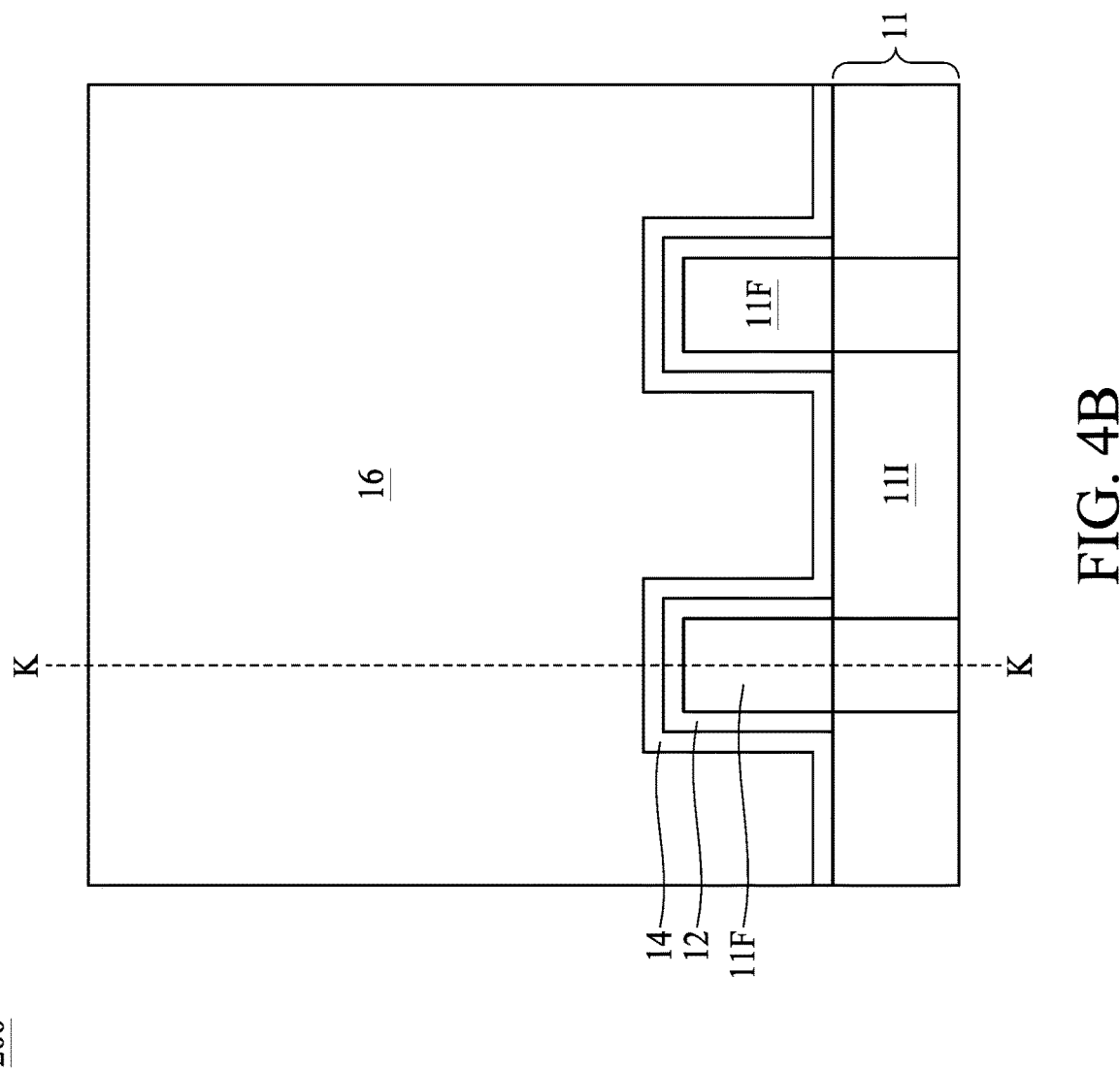
FIG. 4B is a schematic drawing illustrating a cross sectional view taken along line J-J of FIG. 4A, according to some embodiments of the present disclosure.

Referring to FIG. 4A and FIG. 4B, FIG. 4A is a cross sectional view of a semiconductor device (and is a schematic drawing illustrating a cross sectional view taken along line K-K of FIG. 4B), and FIG. 4B is a schematic drawing illustrating a cross sectional view taken along line J-J of FIG. 4A, according to some embodiments of the present disclosure. The semiconductor device 200 includes a substrate 11 and a plurality of fins 11F over the substrate 11, and further includes a source region 11S and a drain region 11D. The spacer 13 is above the fin 11F, and may be adjacent to the source/drain region 11S/11D. In some embodiments, the spacer 13 may have a multi-layer structure (such as having a first spacer layer 13A and a second spacer layer 13B surrounding the first spacer layer 13A), but the number of layers of the spacer 13 is not limited in the present disclosure. In some embodiments, the spacer 13 includes nitride. An insulation layer INS is above the substrate 11 and laterally surrounding the spacer 13. An isolation region 11I is formed in the substrate 11 and spacing between adjacent fins 11F. An interfacial layer 12 conforms to a top surface and a sidewall of the fins 11F. Herein a material of the substrate 11 may be similar to a material of the substrate 1 discussed in FIG. 1A to FIG. 1E, a material of the interfacial layer 12 may be similar to a material of the interfacial layer 2.

A gate dielectric stack 14 is formed above the fin 11F and over an inner sidewall of the spacer 13. In some embodiments, the gate dielectric stack 14 is coupled to the interfacial layer 12. In some embodiments, a top portion of the gate dielectric stack 14 (including the ferroelectric layer 4 therein) further extends over a top surface of the spacer 13 and a top surface of the insulation layer INS. In some embodiments, the gate dielectric stack 14 further covers a top surface of the substrate 11 between the fins 11F. Herein a composition of the gate dielectric stack 14 (discussed in FIG. 4A to FIG. 8B) may be similar to the gate dielectric stack STK_1 as discussed in FIG. 1A, the multilayer gate dielectric stack STK_2 as discussed in FIG. 1B, the multilayer gate dielectric stack STK_3 as discussed in FIG. 1C, the multilayer gate dielectric stack STK_4 as discussed in FIG. 1D, or the multilayer gate dielectric stack STK_5 as discussed in FIG. 1E. (The details of the composition and properties of the gate dielectric stack 14 can be referred to FIG. 1A to FIG. 1E, and FIG. 2B to FIG. 3B.) A gate 16 is over the fin 11F and the gate dielectric stack 14, wherein the gate dielectric stack 14 continuously spaces between the gate 16 and the spacer 13, between the gate 16 and interfacial layer 12, and between the gate 16 and the substrate 11. A top surface of the gate 16 may be exposed from the top portion of the gate dielectric stack 14. In some embodiments, the gate 16 may include metal that can be utilized as a metal gate material.

Figure 5A:
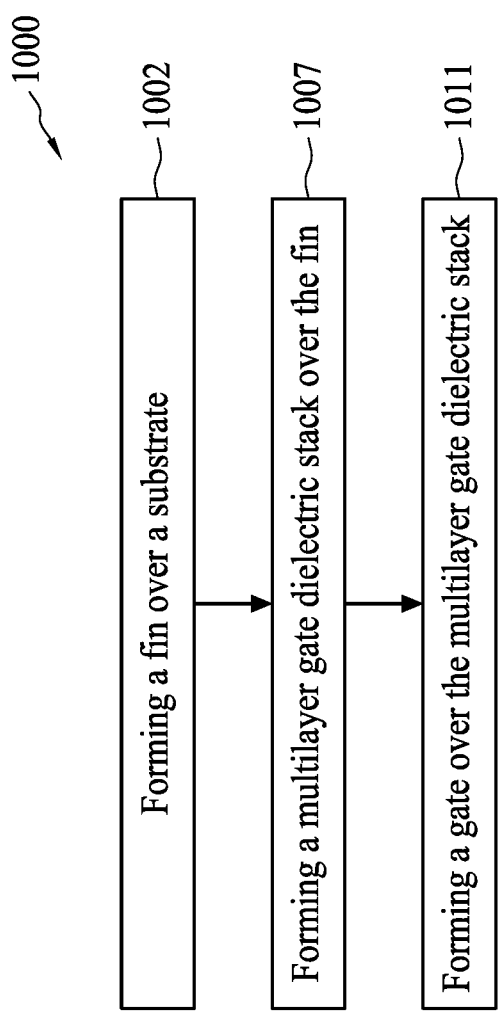
FIG. 5A shows a flow chart representing method of fabricating a semiconductor device, in accordance with some embodiments of the present disclosure.

Referring to FIG. 5A, FIG. 5A shows a flow chart representing method of fabricating a semiconductor device, in accordance with some embodiments of the present disclosure. The method 1000 for fabricating a semiconductor device includes forming a fin over a substrate (operation 1002, which can be referred to FIG. 6A and FIG. 6B), forming a multilayer gate dielectric stack over the fin (operation 1007, which can be referred to FIG. 7A to FIG. 7B), and forming a gate over the multilayer gate dielectric stack (operation 1011, which can be referred to FIG. 8A and FIG. 8B).

Figure 5B:
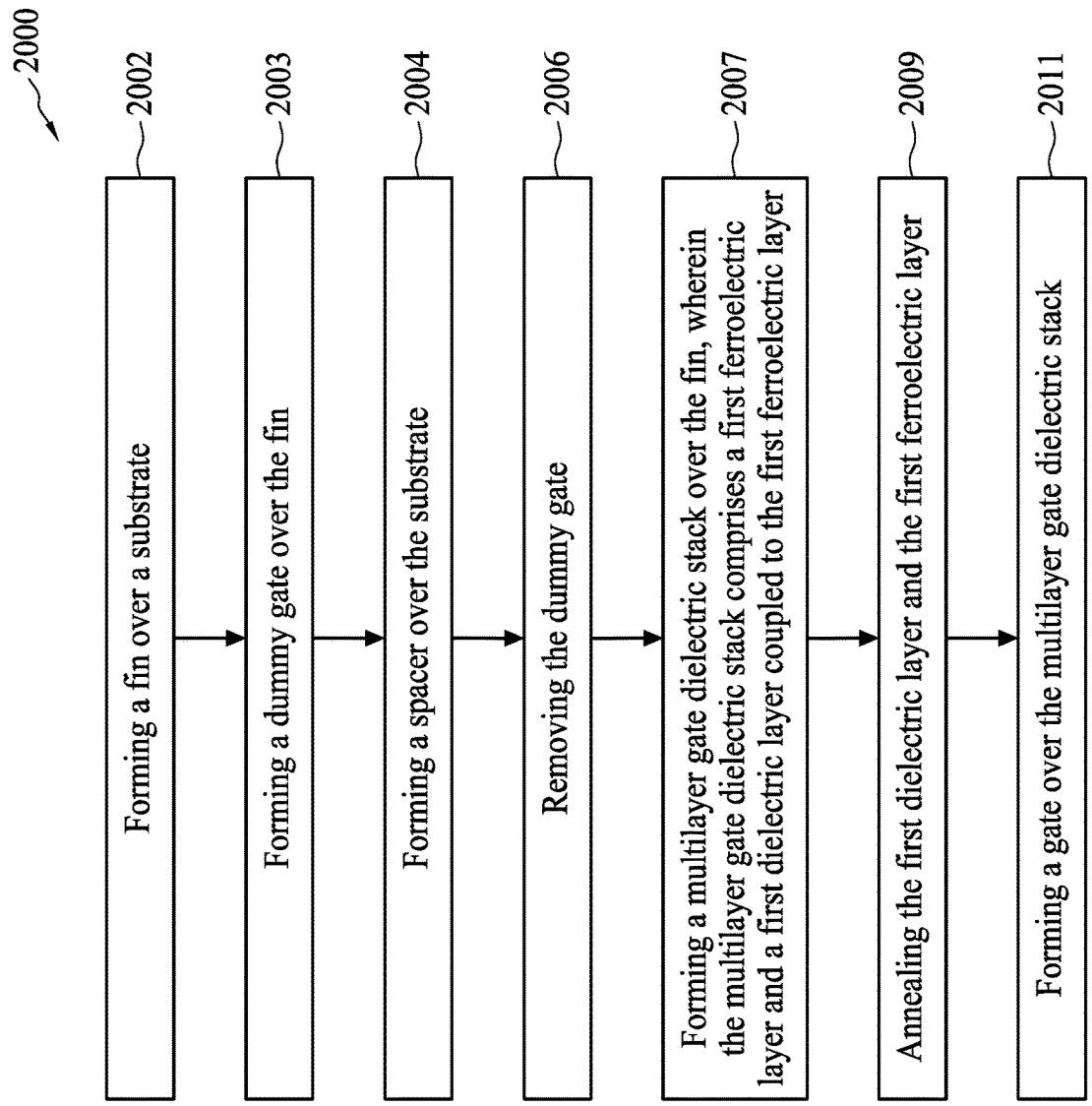
FIG. 5B shows a flow chart representing method of fabricating a semiconductor device, in accordance with some embodiments of the present disclosure.

Referring to FIG. 5B, FIG. 5B shows a flow chart representing method of fabricating a semiconductor device, in accordance with some embodiments of the present disclosure. The method 2000 for fabricating a semiconductor device includes forming a fin over a substrate (operation 2002, which can be referred to FIG. 6A and FIG. 6B), forming a dummy gate over the fin (operation 2003, which can be referred to FIG. 6A and FIG. 6B), forming a spacer over the substrate (operation 2004, which can be referred to FIG. 6A and FIG. 6B), removing the dummy gate (operation 2006, which can be referred to FIG. 7A to FIG. 7B), forming a multilayer gate dielectric stack over the fin, wherein the multilayer gate dielectric stack comprises a first ferroelectric layer and a first dielectric layer coupled to the first ferroelectric layer (operation 2007, which can be referred to FIG. 7A to FIG. 7B), annealing the first dielectric layer and the first ferroelectric layer (operation 2009, which can be referred to FIG. 7A to FIG. 7B), and forming a gate over the multilayer gate dielectric stack (operation 2011, which can be referred to FIG. 8A and FIG. 8B).

Figure 6A:
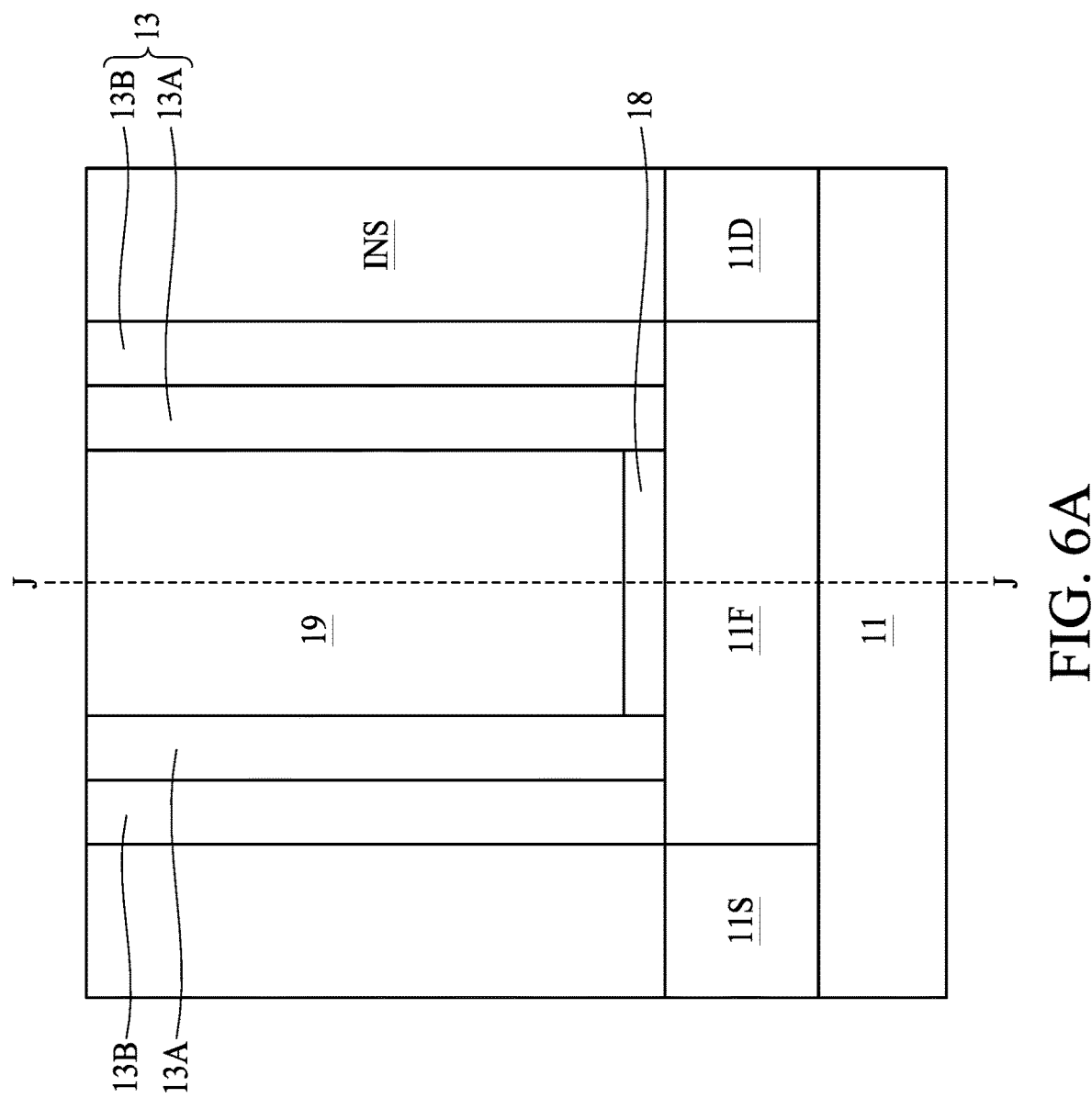
FIG. 6A is a cross sectional view of a semiconductor structure during intermediate stages of manufacturing operations, according to some embodiments of the present disclosure.
Figure 6B:
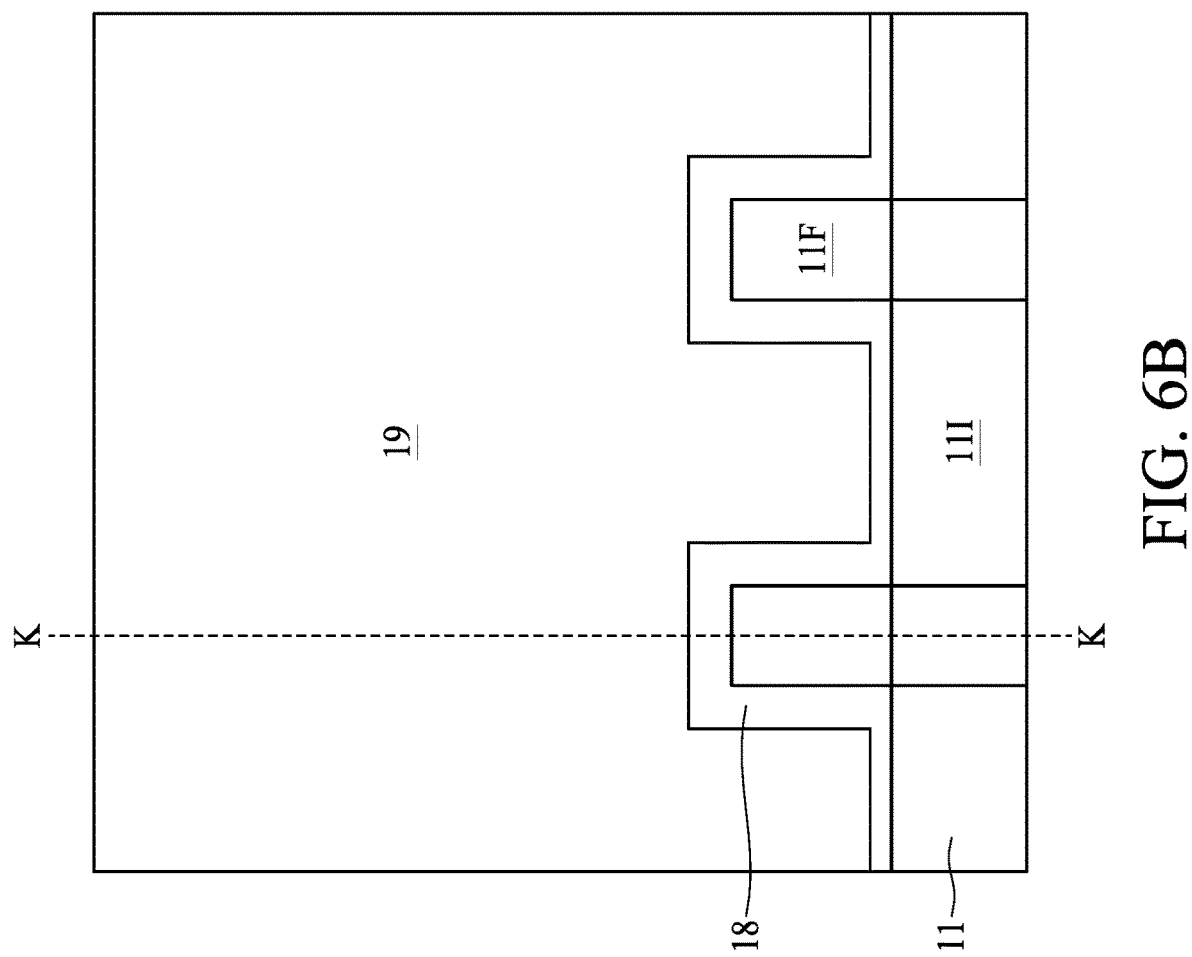
FIG. 6B is a schematic drawing illustrating a cross sectional view taken along line J-J of FIG. 6A, according to some embodiments of the present disclosure.

Referring to FIG. 6A and FIG. 6B, FIG. 6A is a cross sectional view of a semiconductor structure during intermediate stages of manufacturing operations (and is a schematic drawing illustrating a cross sectional view taken along line K-K of FIG. 6B), and FIG. 6B is a schematic drawing illustrating a cross sectional view taken along line J-J of FIG. 6A, according to some embodiments of the present disclosure. A substrate 11 is provided, and a plurality of fins 11F is formed over the substrate 11. In some embodiments, an isolation region 11I is formed between the fins 11F. A sacrificial gate material is formed over the substrate 11 and the fins 11F, and patterned to form a sacrificial gate layer 19 (which can also be referred to as a dummy poly-gate layer) extending in a direction orthogonal to the fins 11F. A spacer 13 is formed on a sidewall of the sacrificial gate layer 19.

Optionally, the spacer 13 may be a multi-layer structure (for example, having a first layer 13A and a second layer 13B, but the present disclosure is not limited thereto). A source region 11S and a drain region 11D are formed in the fins 11F at opposite sides of the sacrificial gate layer 19. In some embodiments, prior to forming the sacrificial gate layer 19, a dummy oxide layer 18 can be formed to conform to a top surface and sidewalls of a fin 11F, wherein the dummy oxide layer 18 is subsequently covered by the sacrificial gate layer 19. An insulation layer INS is formed to surround the spacer 13.

Figure 7A:
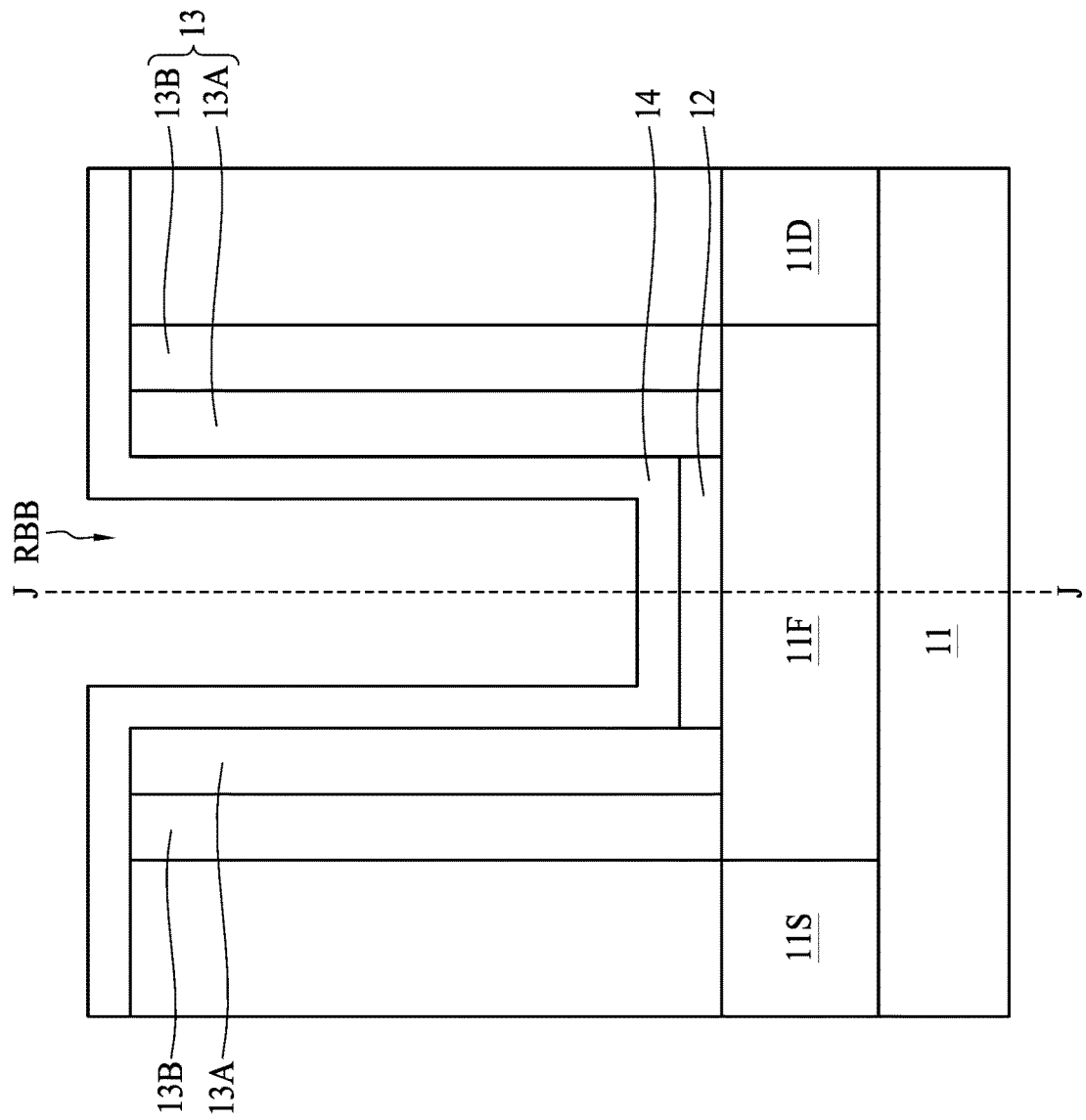
FIG. 7A is a cross sectional view of a semiconductor structure during intermediate stages of manufacturing operations, according to some embodiments of the present disclosure.
Figure 7B:
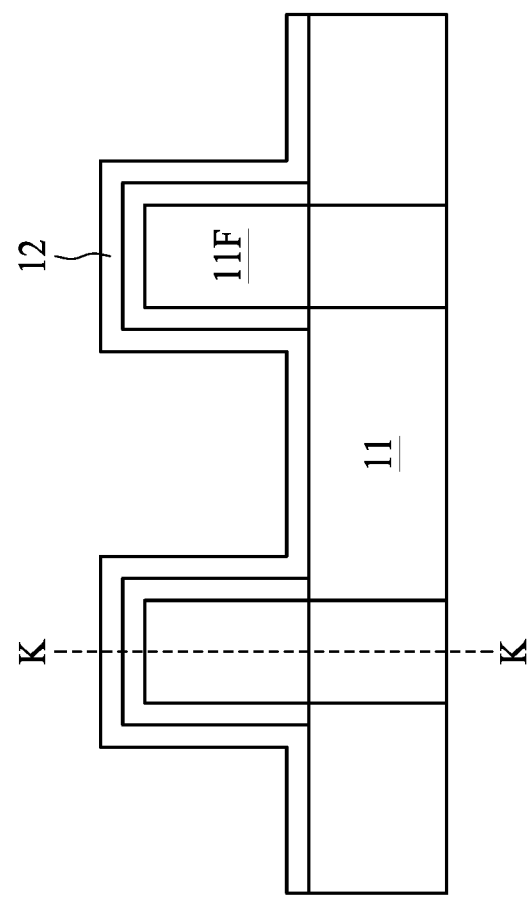
FIG. 7B is a schematic drawing illustrating a cross sectional view taken along line J-J of FIG. 7A, according to some embodiments of the present disclosure.

Referring to FIG. 7A and FIG. 7B, FIG. 7A is a cross sectional view of a semiconductor structure during intermediate stages of manufacturing operations (and is a schematic drawing illustrating a cross sectional view taken along line K-K of FIG. 7B), FIG. 7B is a schematic drawing illustrating a cross sectional view taken along line J-J of FIG. 7A, according to some embodiments of the present disclosure. The dummy oxide layer 18 and the sacrificial gate layer 19 illustrated in FIG. 6A are subsequently removed by a removal operation, and an opening RBB surrounded by the spacer 13 is thereby formed. An interfacial layer 12 is formed over the fin 11F in the opening RBB (optionally, a portion of the interfacial layer 12 can be on a sidewall of the opening RBB), and the gate dielectric stack 14 is formed over the interfacial layer 12. In some embodiments, the gate dielectric stack 14 is on an inner sidewall of the spacer 13 (i.e. sidewall of the opening RBB) and over a top surface of the substrate 11 exposed from the spacer 13 and the insulation layer INS. In some embodiments, the gate dielectric stack 14 has a top portion extending above a top surface of the spacer 13 and a top surface of the insulation layer INS. In some embodiments, the interfacial layer 12 includes oxide, and the interfacial layer 12 can improve a better growth starting facet for depositing the gate dielectric stack 14, Specifically, in the embodiment of the gate dielectric stack 14 includes multilayer gate dielectric stack STK_4, the operation of forming the gate dielectric stack 14 includes forming an interfacial layer 2* over the ferroelectric layer(s) 4. The interfacial layer 2* may include a non-polarization material, such as interfacial dielectric, high-k material, oxide materials such as $SiO_x$, $GeO_x$, $SiGeO_x$, $AlO_x$, $YO_x$, $AlGeO_x$, $YGeO_x$, hafnium-based materials such as $HfO_x$, HfON, HfSiO$_x$, HfSiON, or the like. Optionally, a post-deposition annealing (PDA) operation is performed to improve the quality of the gate dielectric stack 14.

Alternatively, a gate dielectric stack previously formed in the opening RBB does not have desired/adequate ferroelectricity. In some embodiments, such gate dielectric stack includes a dielectric layer that entails further operation to be converted into a ferroelectric layer. For example, by performing the operations subsequently discussed, at least a portion of an amorphous hafnium oxide material in the gate dielectric stack can be converted into crystallized phase (e.g. orthorhombic phase), thereby forming a gate dielectric stack 14 that has a desired ferroelectricity.

Optionally, by forming an overlying capping layer (which may include dielectric material) doped with a dopant, such as lanthanum (La), silicon (Si), nitride (N), yttrium (Y), gadolinium (Gd), and followed by a post-cap annealing operation, the dopant can be diffused into the ferroelectric layer(s) 4 in the gate dielectric stack 14, the presence of dopant can help the annealing operation of converting a portion of the ferroelectric layer(s) 4 in the gate dielectric stack 14 to a crystalized phase, wherein the crystalized phase of such material may be orthorhombic, tetragonal, cubic, or distorted monoclinic, or alternatively, nanocrystalline, polycrystalline, or epitaxy. In the case of the ferroelectric layer(s) 4 in the gate dielectric stack 14 includes hafnium oxide, at least a portion of the gate dielectric stack 14 is converted from non-crystallized phase (such as amorphous) to orthorhombic phase. Alternatively, the entire ferroelectric layer(s) 4 in the gate dielectric stack 14 is converted into crystalized phase. By performing the aforesaid annealing operation(s) and implant operations, a ferroelectricity of the gate dielectric stack 14 can be improved.

Figure 8A:
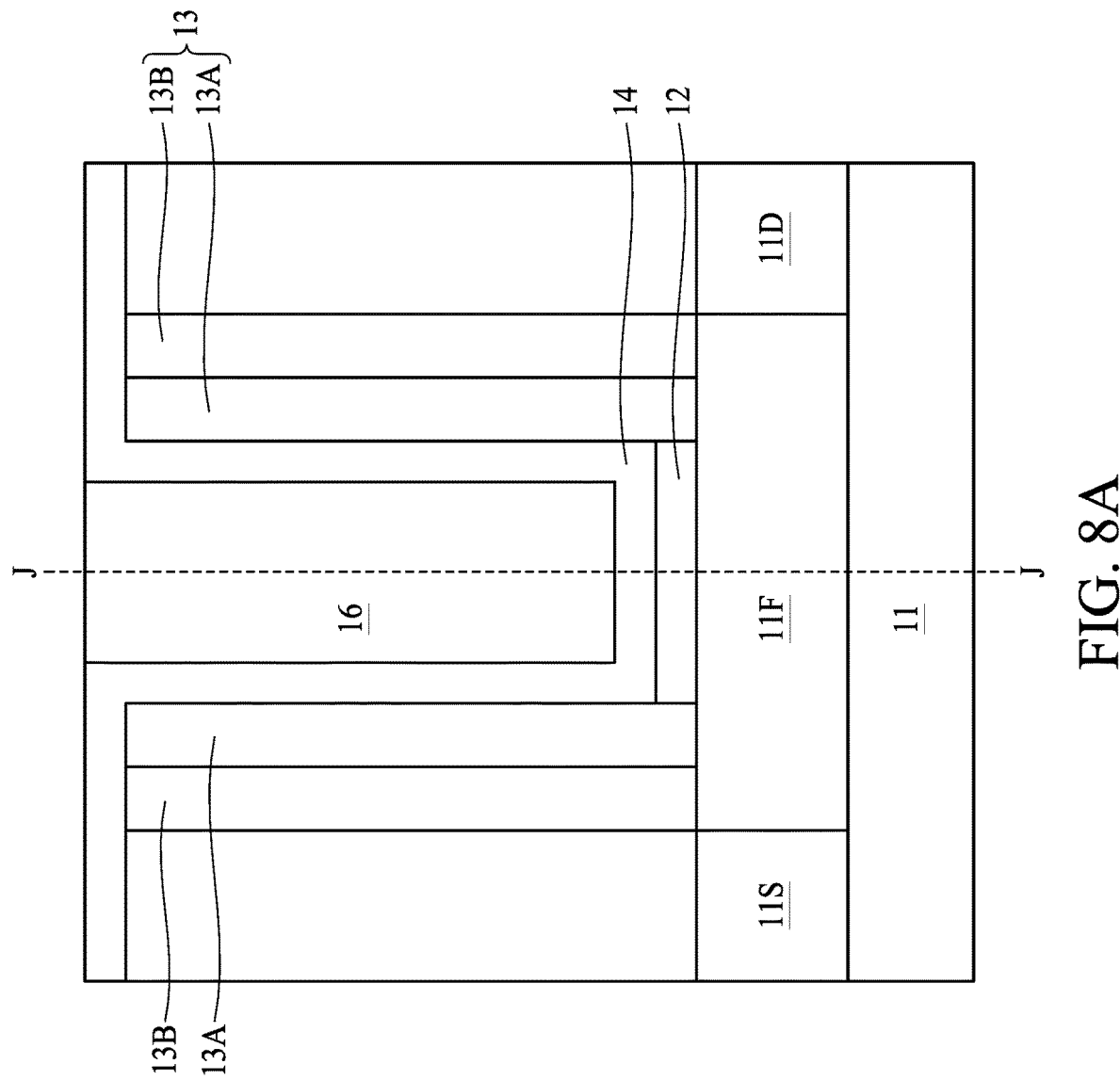
FIG. 8A is a cross sectional view of a semiconductor structure during intermediate stages of manufacturing operations, according to some embodiments of the present disclosure.

Referring to FIG. 8A and FIG. 8B, FIG. 8A is a cross sectional view of a semiconductor structure during intermediate stages of manufacturing operations (and is a schematic drawing illustrating a cross sectional view taken along line K-K of FIG. 8B), FIG. 8B is a schematic drawing illustrating a cross sectional view taken along line J-J of FIG. 8A, according to some embodiments of the present disclosure. A gate material is formed in the opening RBB (shown in FIG. 7A to FIG. 7B) and over the gate dielectric stack 14. In some embodiments, the gate material includes work function metal gate material. A planarization operation, such as chemical mechanical planarization (CMP) operation, can be performed to remove excessive materials composing the gate 16 from above the gate level, fully remove or remove a portion of the gate dielectric stack 14 at the top of gate level, thereby the gate 16 formation operation is concluded by having conductive materials in the opening RBB and laterally surrounded by the spacer 13.

Figure 9A:
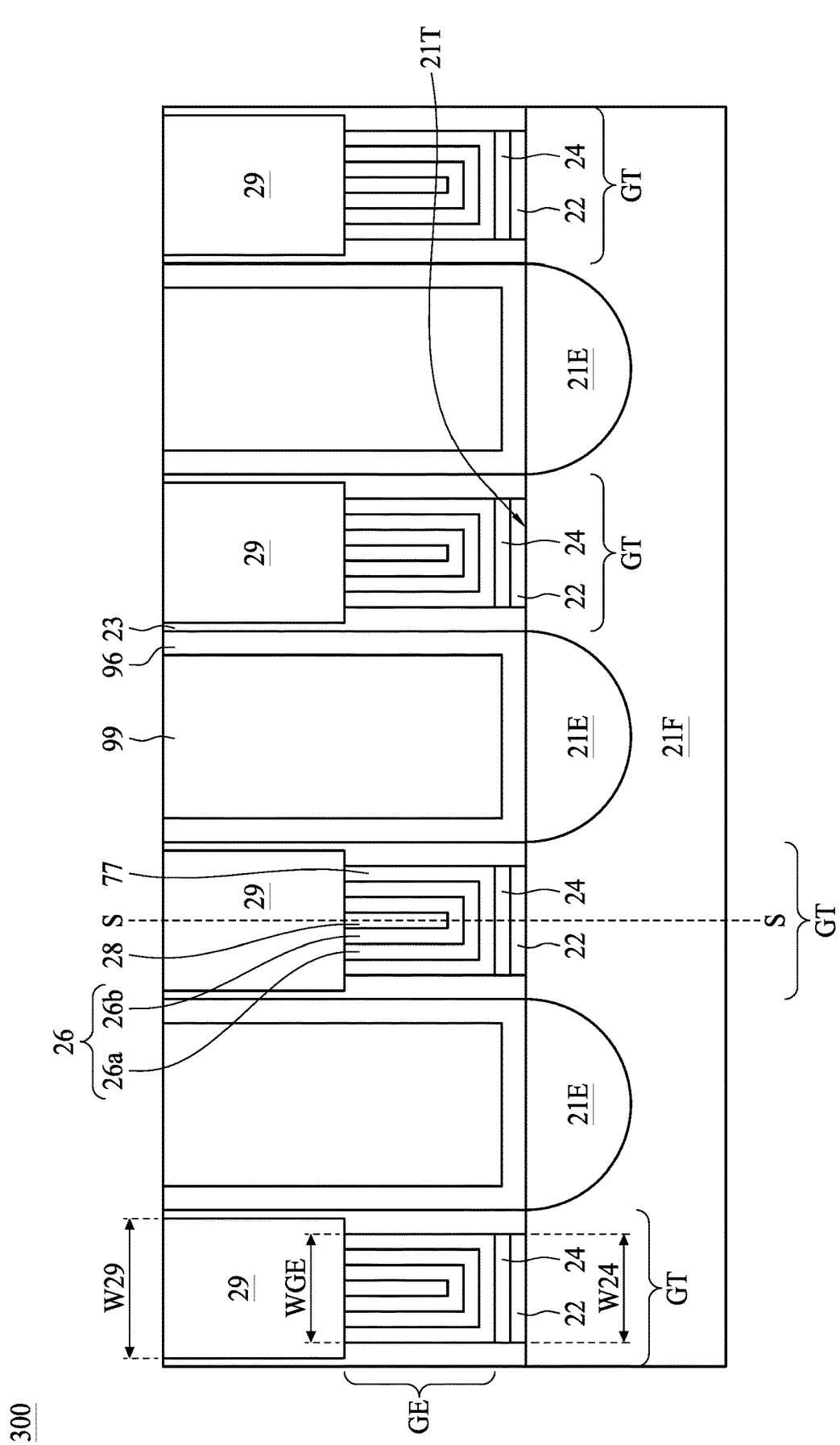
FIG. 9A is a cross sectional view of a semiconductor device, according to some embodiments of the present disclosure.
Figure 9B:
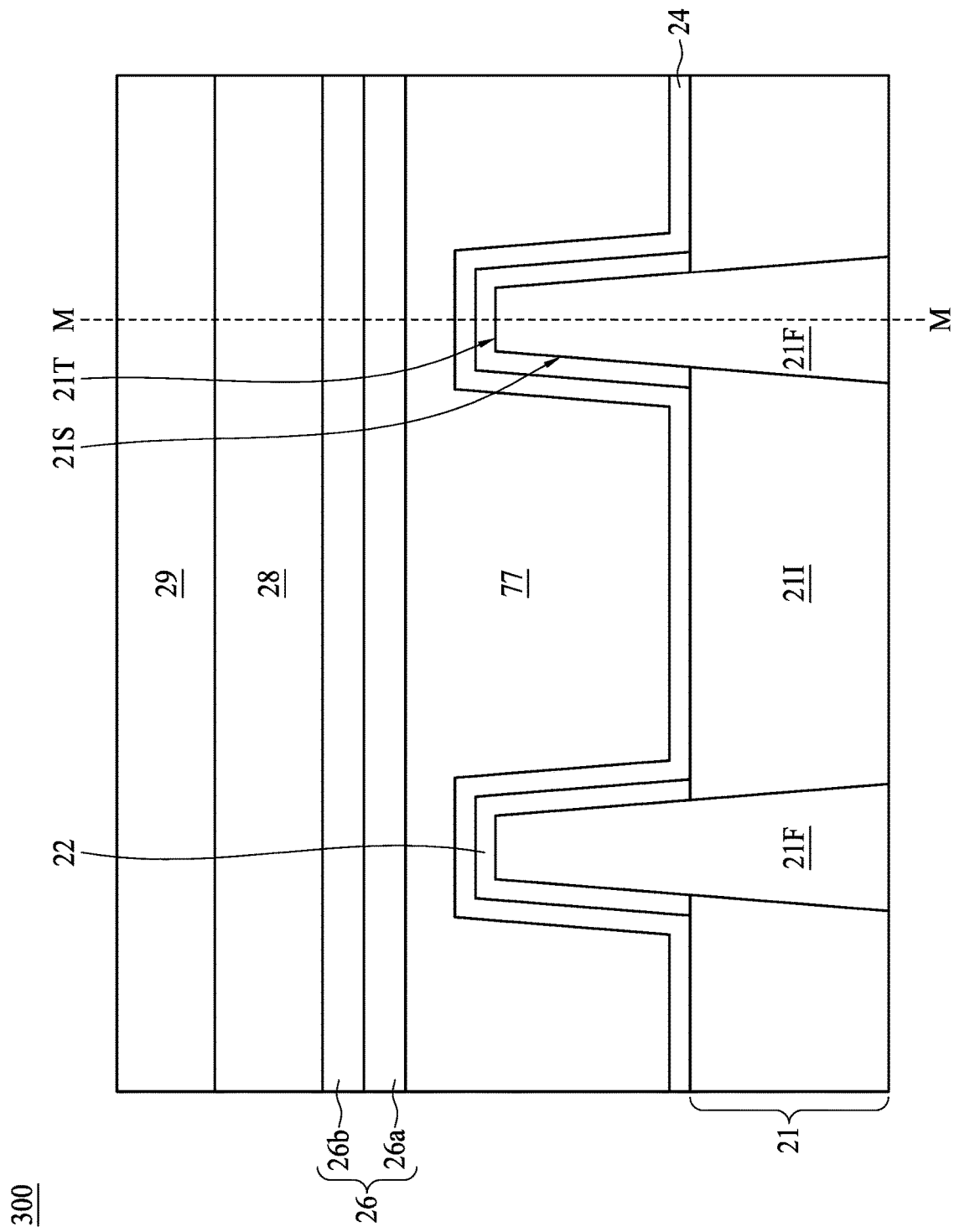
FIG. 9B is a schematic drawing illustrating a cross sectional view taken along line S-S of FIG. 9A, according to some embodiments of the present disclosure.

Embodiments related to a semiconductor device 300 is discussed in FIG. 9A to FIG. 11G. Referring to FIG. 9A, FIG. 9A is a cross sectional view of a semiconductor device (and is a schematic drawing illustrating a cross sectional view taken along line M-M of FIG. 9B), FIG. 9B is a schematic drawing illustrating a cross sectional view taken along line S-S of FIG. 9A, according to some embodiments of the present disclosure. The semiconductor device 300 has a substrate 21, wherein a plurality of fins 21F are formed above the substrate 21. Isolation regions 211 are formed between fins 21F. A plurality of epitaxial regions 21E (which can be a doped region, such as source/drain region) is formed at a top surface 21T of the fin 21F.

Each of contact plugs 99 is correspondingly formed over an epitaxial region 21E. In some embodiments, the semiconductor device 300 further include a self-aligned silicide layer 162 spacing between the contact plug 99 and the epitaxial regions 21E. In some embodiments, an edge of the self-aligned silicide layer 162 is aligned with an edge of the epitaxial region 21E. Optionally, a portion of the self-aligned silicide layer 162 further extends along a sidewall of the contact plug 99. The contact plug 99, the epitaxial regions 21E, and the self-aligned silicide layer 162 can be utilized as a portion of a source/drain structure. An interfacial layer 22 is over a top surface and a sidewall of a fin 21F. A gate dielectric stack 24 is above and coupled to the interfacial layer 22. Herein a composition of the gate dielectric stack 24 (discussed in FIG. 9A to FIG. 11G) may be similar to the gate dielectric stack STK_1 as discussed in FIG. 1A, the multilayer gate dielectric stack STK_2 as discussed in FIG. 1B, the multilayer gate dielectric stack STK_3 as discussed in FIG. 1C, the multilayer gate dielectric stack STK_4 as discussed in FIG. 1D, or the multilayer gate dielectric stack STK_5 as discussed in FIG. 1E. (The details of the composition and properties of the gate dielectric stack 24 can be referred to FIG. 1A to FIG. 1E, and FIG. 2B to FIG. 3B.) The gate dielectric stack 24 conforms to a profile of the fins 21F and the interfacial layer 22. Alternatively stated, ferroelectric layer(s) 4 in the gate dielectric stack 24 covers a top surface 21T and a sidewall 21F of the fin 21F.

A barrier layer 77 is disposed above the gate dielectric stack 24, wherein the barrier layer 77 is configured to conduct electricity and prevent inter-diffusion and reaction between metals, silicon, or dielectric materials. The barrier layer 77 may include refractory metal, such as TiN, TaN, $W_2N$, TiSiN, TaSiN, or the like.

A work function stack 26 is disposed over and surrounded by the barrier layer 77. In some embodiments, the work function stack 26 is a multi-layer structure. In an example shown in the FIG. 9A, the work function stack 26 includes two work function layers 26a and 26b, but it should be noted that a total number of the work function layers is not limited in the present disclosure. A metal layer 28 is disposed over the work function stack 26, and a self-aligned contact (SAC) hard mask layer 29 is disposed above the metal layer 28. A material of the substrate 21 may be similar to the substrate 1 or the substrate 11 previously discussed. A material of the interfacial layer 22 may be similar to the interfacial layer 2 or the interfacial layer 12 previously discussed.

A gate region structure GT is disposed over the fins 21F and between adjacent conductive plugs 99. The gate region structure GT includes a gate GE, a gate dielectric stack 24 between the gate GE and the substrate 21, and the interfacial layer 22. The gate GE includes the barrier layer 77, the work function stack 26 and the metal layer 28. The self-aligned contact (SAC) hard mask layer 29 is above the gate GE, and a spacer 23 laterally surrounds the SAC hard mask layer 29, the gate GE, the gate dielectric stack 24, and the interfacial layer 22. In some embodiments, a width W29 of the SAC hard mask layer 29 is greater than either a width W24 of the gate dielectric stack 24 or a width WGE of the gate GE. In some embodiments, the SAC hard mask layer 29 includes silicon nitride layer 29.

Figure 10A:
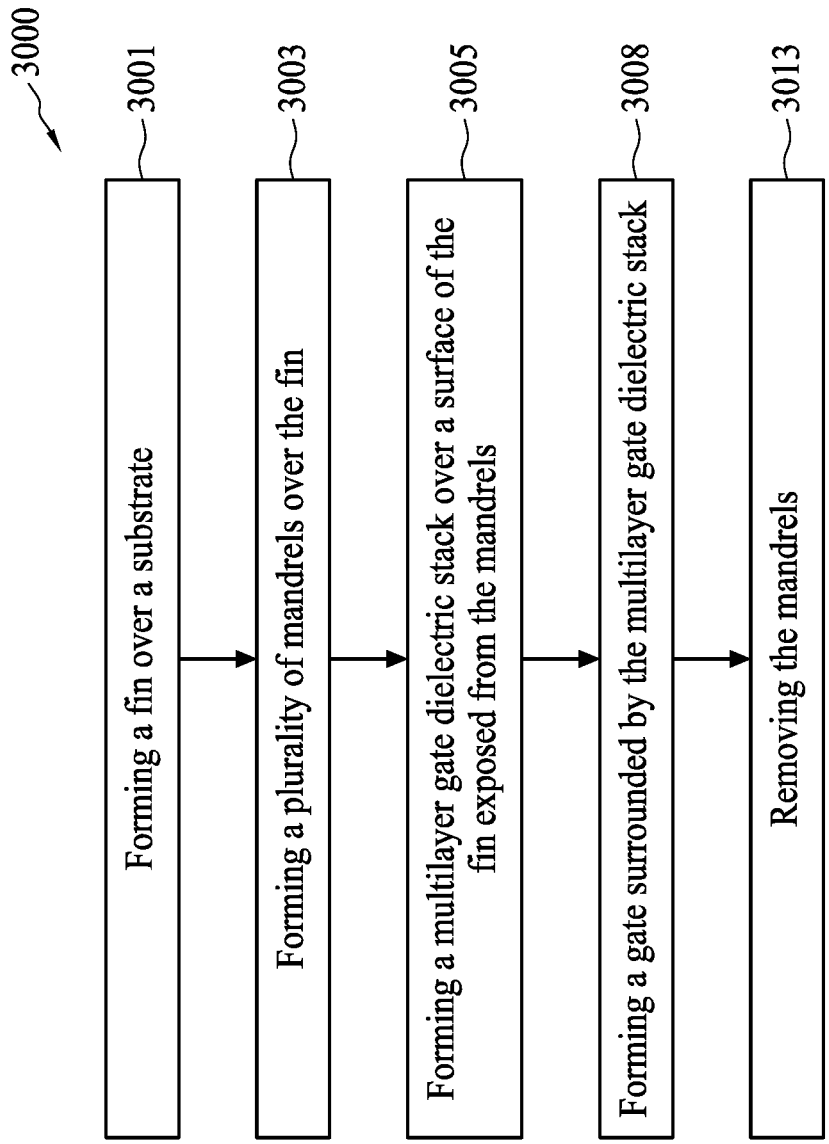
FIG. 10A shows a flow chart representing method of fabricating a semiconductor device, in accordance with some embodiments of the present disclosure.

Referring to FIG. 10A, FIG. 10A shows a flow chart representing method of fabricating a semiconductor device, in accordance with some embodiments of the present disclosure. The method 3000 for fabricating a semiconductor device includes forming a fin over a substrate (operation 3001, which can be referred to FIG. 11A), forming a plurality of mandrels over the fin (operation 3003, which can be referred to FIG. 11A), forming a multilayer gate dielectric stack over a surface of the fin exposed from the mandrels (operation 3005, which can be referred to FIG. 11B), forming a gate surrounded by the multilayer gate dielectric stack (operation 3008, which can be referred to FIG. 11B), and removing the mandrels (operation 3013, which can be referred to FIG. 11E).

Figure 10B:
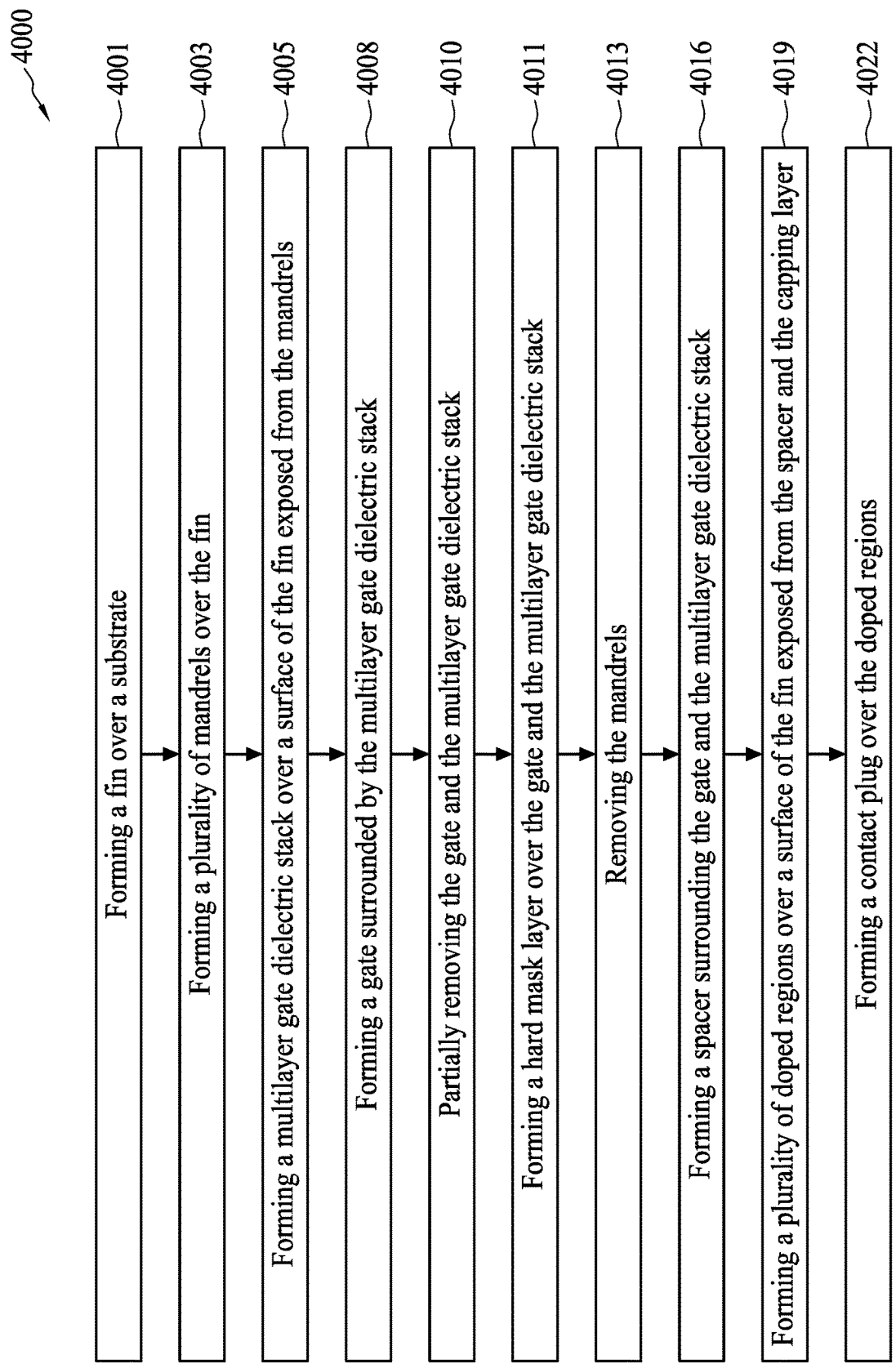
FIG. 10B shows a flow chart representing method of fabricating a semiconductor device, in accordance with some embodiments of the present disclosure.

Referring to FIG. 10B, FIG. 10B shows a flow chart representing method of fabricating a semiconductor device, in accordance with some embodiments of the present disclosure. The method 4000 for fabricating a semiconductor device includes forming a fin over a substrate (operation 4001, which can be referred to FIG. 11A), forming a plurality of mandrels over the fin (operation 4003, which can be referred to FIG. 11A), forming a multilayer gate dielectric stack over a surface of the fin exposed from the mandrels (operation 4005, which can be referred to FIG. 11B), forming a gate surrounded by the multilayer gate dielectric stack (operation 4008, which can be referred to FIG. 11B), partially removing the gate and the multilayer gate dielectric stack (operation 4010, which can be referred to FIG. 11C), forming a hard mask layer over the gate and the multilayer gate dielectric stack (operation 4011, which can be referred to FIG. 11D), removing the mandrels (operation 4013, which can be referred to FIG. 11E), forming a spacer surrounding the gate and the multilayer gate dielectric stack (operation 4016, which can be referred to FIG. 11F), forming a plurality of doped regions over a surface of the fin exposed from the spacer and the capping layer (operation 4019, which can be referred to FIG. 11F), and forming a contact plug over the doped regions (operation 4022, which can be referred to FIG. 11G).

Figure 11A:
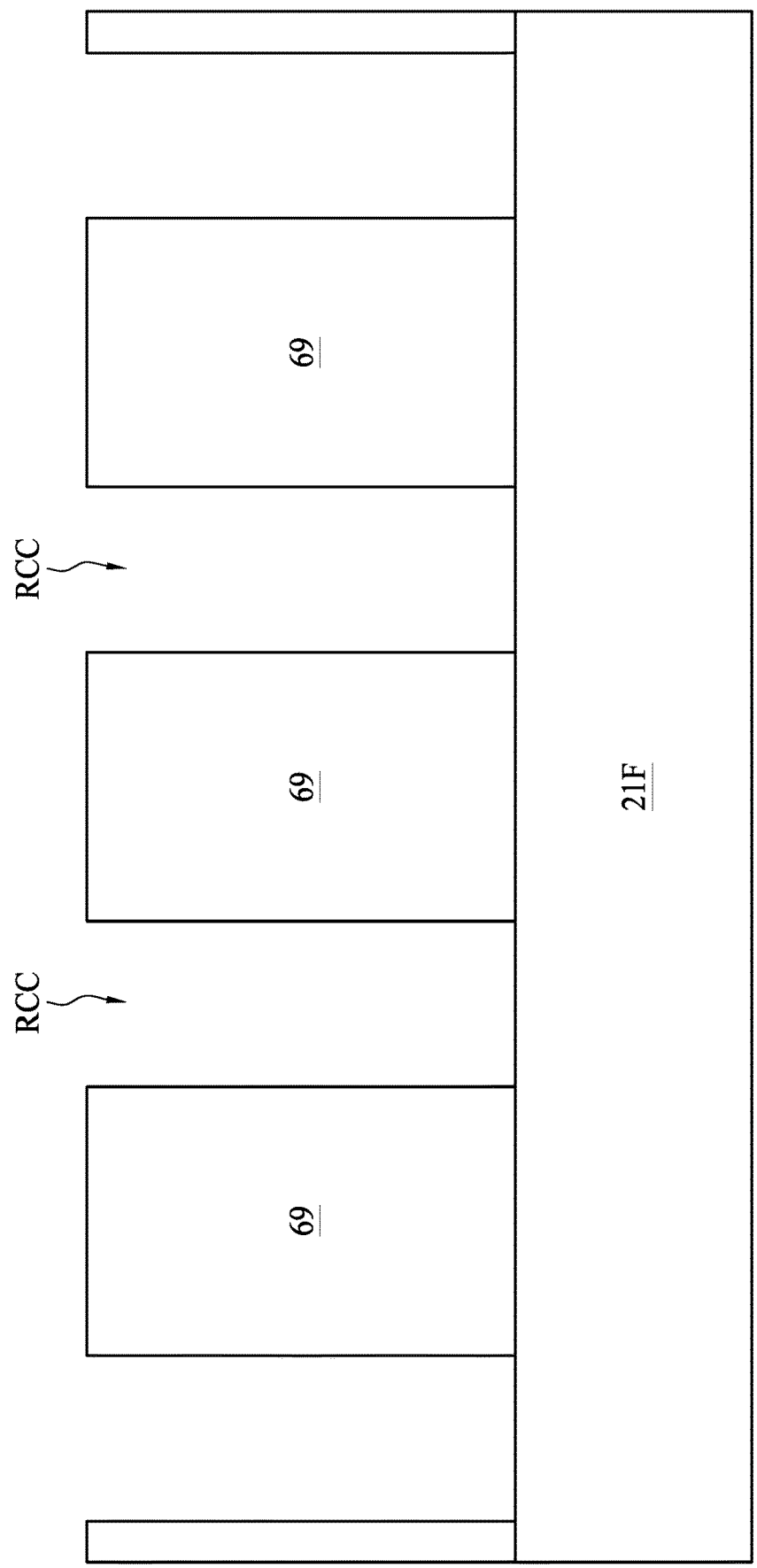
FIG. 11A to FIG. 11G are cross sectional views of a semiconductor structure during intermediate stages of manufacturing operations, according to some embodiments of the present disclosure.

Referring to FIG. 11A, FIG. 11A is a cross sectional view of a semiconductor structure during intermediate stages of manufacturing operations, according to some embodiments of the present disclosure. A plurality of fins 21F are formed over a substrate 21 (shown in FIG. 9B), and a plurality of mandrels 69 are formed over the fins 21F. In some embodiments, the mandrels 69 may include polycrystalline-silicon (polysilicon), poly-crystalline silicon-germanium (poly-SiGe), metallic nitrides, metallic silicides, metallic oxides, metals and the like. Optionally, a silicon oxide layer or a silicon nitride layer can be formed between the mandrels 69 and the fins 21F. In some embodiments, a plurality of openings RCC is formed by patterning and/or etching the mandrels 69, and a surface of a fin 21F is exposed from the mandrels 69.

Figure 11B:
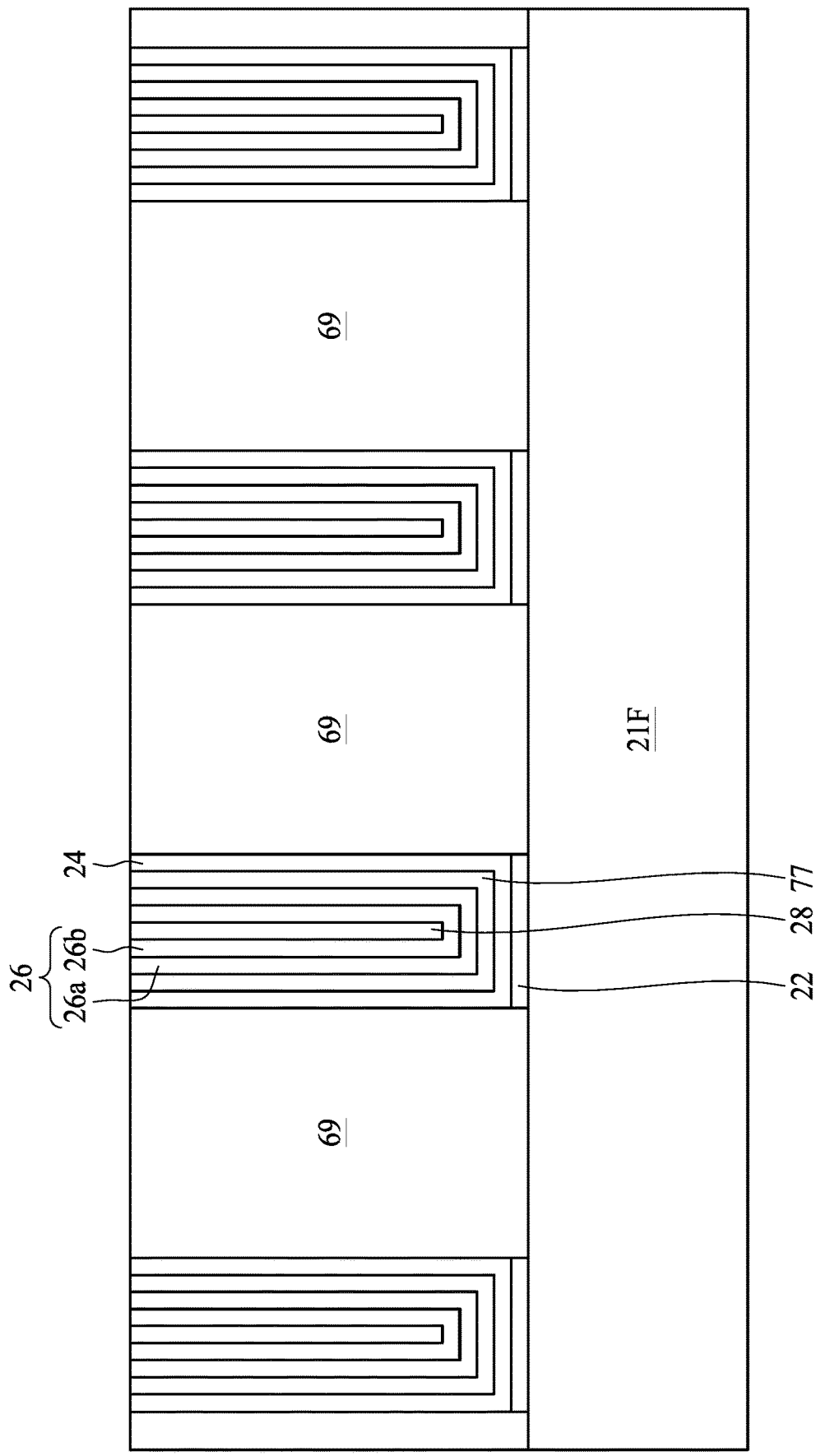

Referring to FIG. 11B, FIG. 11B is a cross sectional view of a semiconductor structure during intermediate stages of manufacturing operations, according to some embodiments of the present disclosure. An interfacial layer 22 is formed over the exposed surface of the fins 21F. A gate dielectric stack 24 is formed over the interfacial layer 22, wherein the gate dielectric stack 24 conforms to a sidewall of the opening RCC. Similar to the discussion in FIG. 7A to FIG. 7B, a post-deposition annealing (PDA) operation can optionally be performed to improve the quality of the gate dielectric stack 24. Optionally, when a gate dielectric stack previously formed in the opening RCC does not have desired/adequate ferroelectricity, by forming an overlying capping layer (which may include dielectric material) doped with a dopant, such as lanthanum (La), silicon (Si), nitride (N), yttrium (Y), gadolinium (Gd), and followed by a post-cap annealing operation, the dopant can be diffused into the ferroelectric layer(s) 4 in the gate dielectric stack 24. The presence of dopant can help the annealing operation of converting a portion of the ferroelectric layer(s) 4 in the gate dielectric stack 24 to a crystalized phase, wherein the crystalized phase of such material may be orthorhombic, tetragonal, cubic, or distorted monoclinic, or alternatively, nanocrystalline, polycrystalline, or epitaxy. In the case of the ferroelectric layer(s) 4 in the gate dielectric stack 24 includes hafnium oxide, at least a portion of the gate dielectric stack 24 is converted from non-crystallized phase (such as amorphous) to orthorhombic phase. Alternatively, the entire ferroelectric layer(s) 4 in the gate dielectric stack 24 is converted into crystalized phase.

The barrier layer 77 is formed in the opening RCC and is laterally surrounded by the gate dielectric stack 24. In some embodiments, the barrier layer 77 has a U-shaped profile, and has a vertical portion in direct contact with an inner sidewall of the gate dielectric stack 24. The work function stack 26 (which may include work function layers 26a and 26b in some of the embodiments) is formed in the opening RCC and is laterally surrounded by the barrier layer 77. The metal layer 28 is formed in the opening RCC and is laterally surrounded by the work function stack 26.

In some embodiments, a portion of the gate dielectric stack 24, the barrier layer 77, the work function stack 26, and/or the metal layer 28 may be formed above the mandrels 69. Therefore, by performing a planarization operation (such as CMP) can be performed to remove such excessive portion above the mandrels 69 and thereby exposing a top surface of the mandrels 69. In some embodiments, a top surface of the gate dielectric stack 24, a top surface of the metal layer 28, a top surface of the work function stack 26 are exposed from the mandrels 69. In some embodiments, a ferroelectric layer 4 (referring to FIG. 1A to FIG. 1E) of the gate dielectric stack 24 is exposed from the mandrels 69.

Figure 11C:
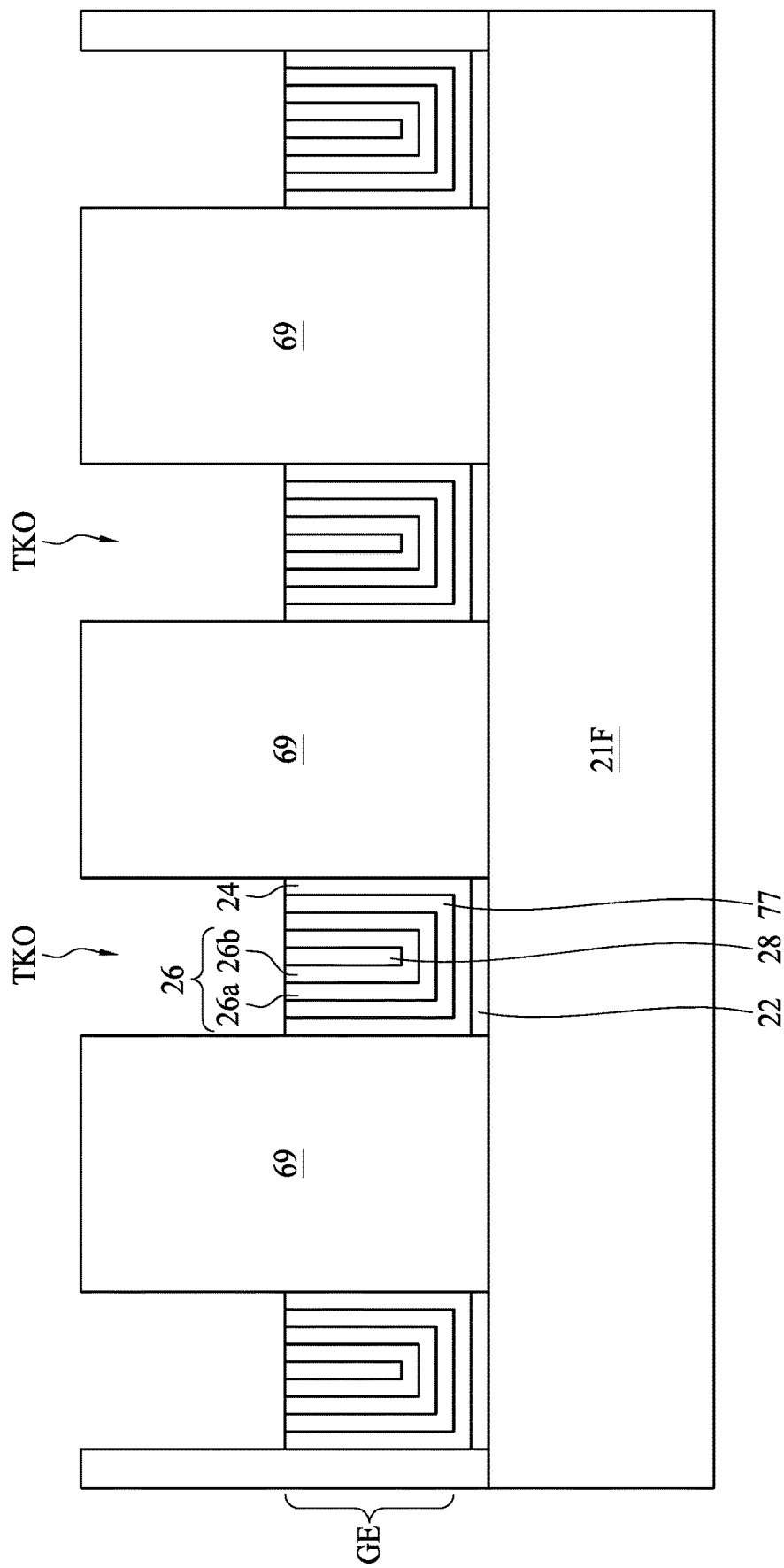

Referring to FIG. 11C, FIG. 11C is a cross sectional view of a semiconductor structure during intermediate stages of manufacturing operations, according to some embodiments of the present disclosure. An upper portion of the gate dielectric stack 24, an upper portion of the metal layer 28, and an upper portion of the work function stack 26 are removed by an etch back operation. A plurality of trenches TKO is thereby formed between the mandrels 69.

Figure 11D:
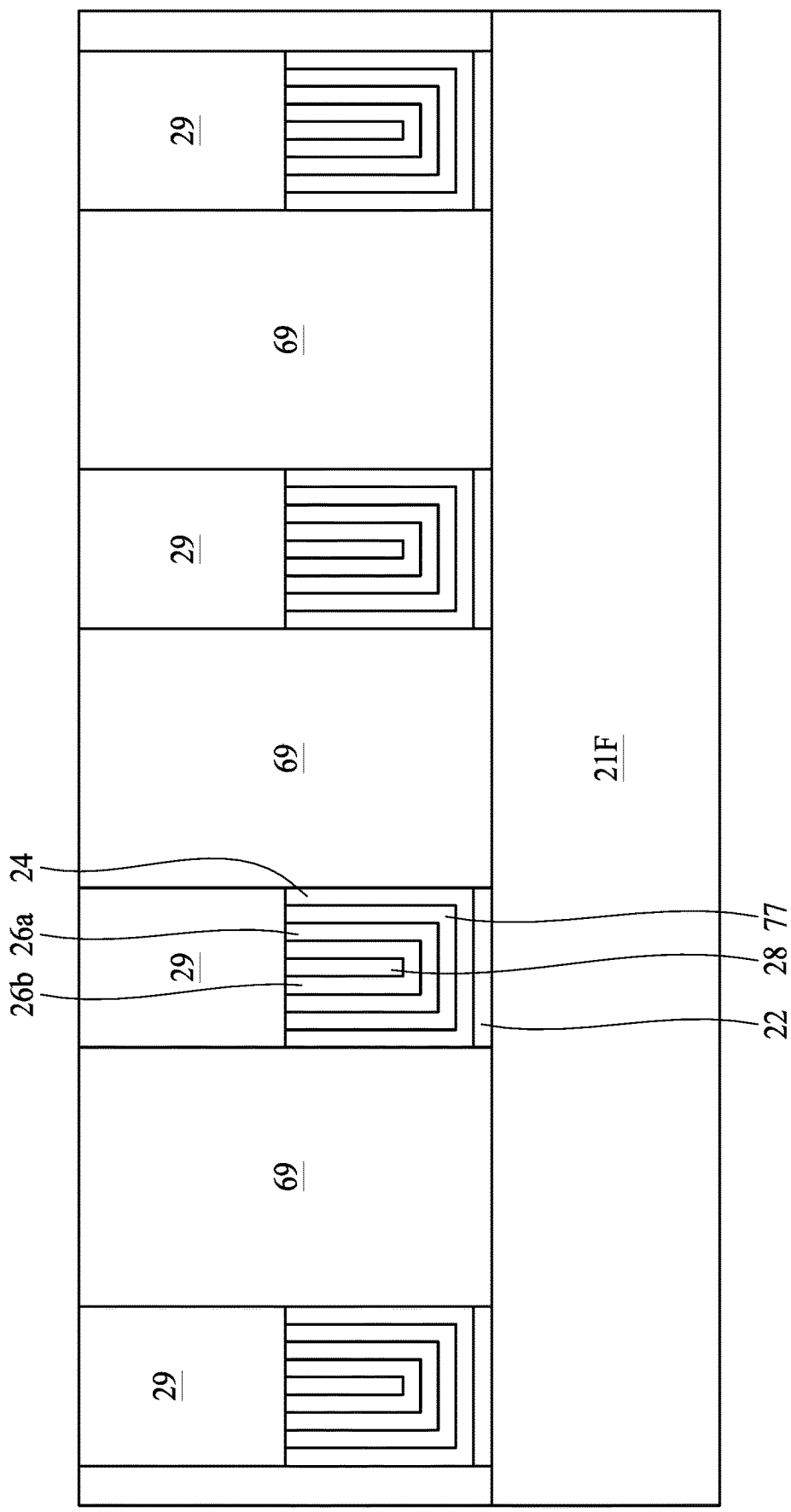

Referring to FIG. 11D, FIG. 11D is a cross sectional view of a semiconductor structure during intermediate stages of manufacturing operations, according to some embodiments of the present disclosure. The SAC hard mask layer 29 is formed in the trenches TKO and over the gate GE. In some embodiments, when a portion of the SAC hard mask layer 29 is formed above a top surface of the mandrels 69, a planarization operation (such as CMP) ca be performed to remove such excessive portion. In some embodiments, the SAC hard mask layer 29 includes silicon nitride.

Figure 11E:
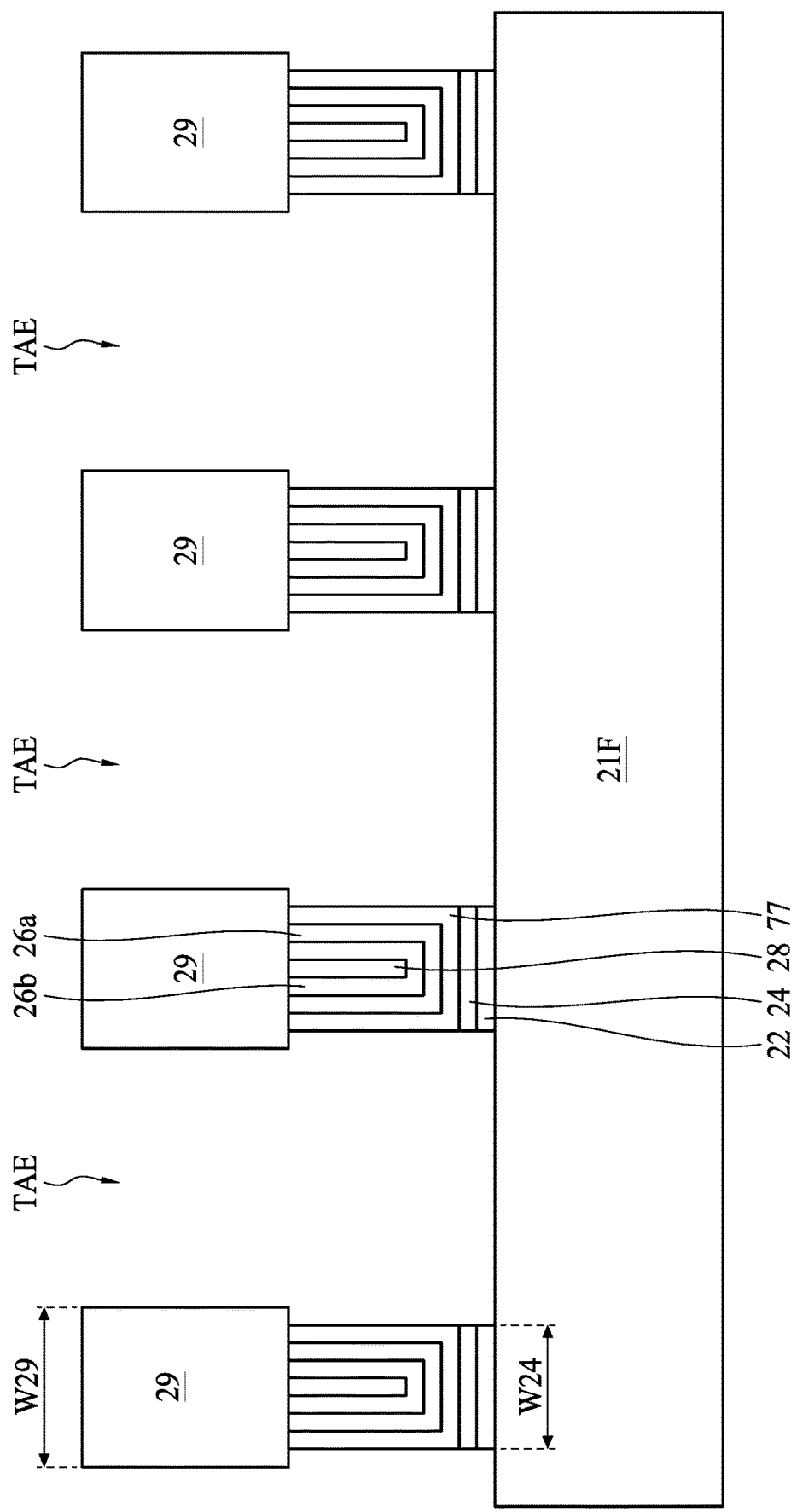

Referring to FIG. 11E, FIG. 11E is a cross sectional view of a semiconductor structure during intermediate stages of manufacturing operations, according to some embodiments of the present disclosure. The mandrels 69 are removed to expose a top surface and a sidewall of the fins 21F. The mandrels 69 can be removed by etching operations, such as anisotropic dry etch operation utilizing reaction gas. It should be noted that, the etch rate of the mandrels 69 (e.g., polycrystalline-silicon, poly-crystalline silicon-germanium, metallic nitrides, metallic silicides, metallic oxides, metals and the like) is greater than the etch rate of the ferroelectric layer 4 of the gate dielectric stack 24 under such etching operation.

However, during the etching operation, a peripheral portion of the gate dielectric stack 24 and/or a portion of the interfacial layer 22 may be simultaneously removed with the mandrels 69. In some embodiments, a material of the ferroelectric layer 4 of the gate dielectric stack 24 can be selected from a group of materials that has an etch rate greater than the etch rate on the silicon nitride under the etching operation. In some embodiments, a vertical portion of the gate dielectric stack 24 on the sidewall of the mandrels 69 is removed. Since an etch rate on the gate dielectric stack 24 and the interfacial layer 22 may be greater than an etch rate of the SAC hard mask layer 29 (which may include silicon nitride), a width W29 of the remaining SAC hard mask layer 29 is greater than a width W24 of the remaining gate dielectric stack 24.

Figure 11F:
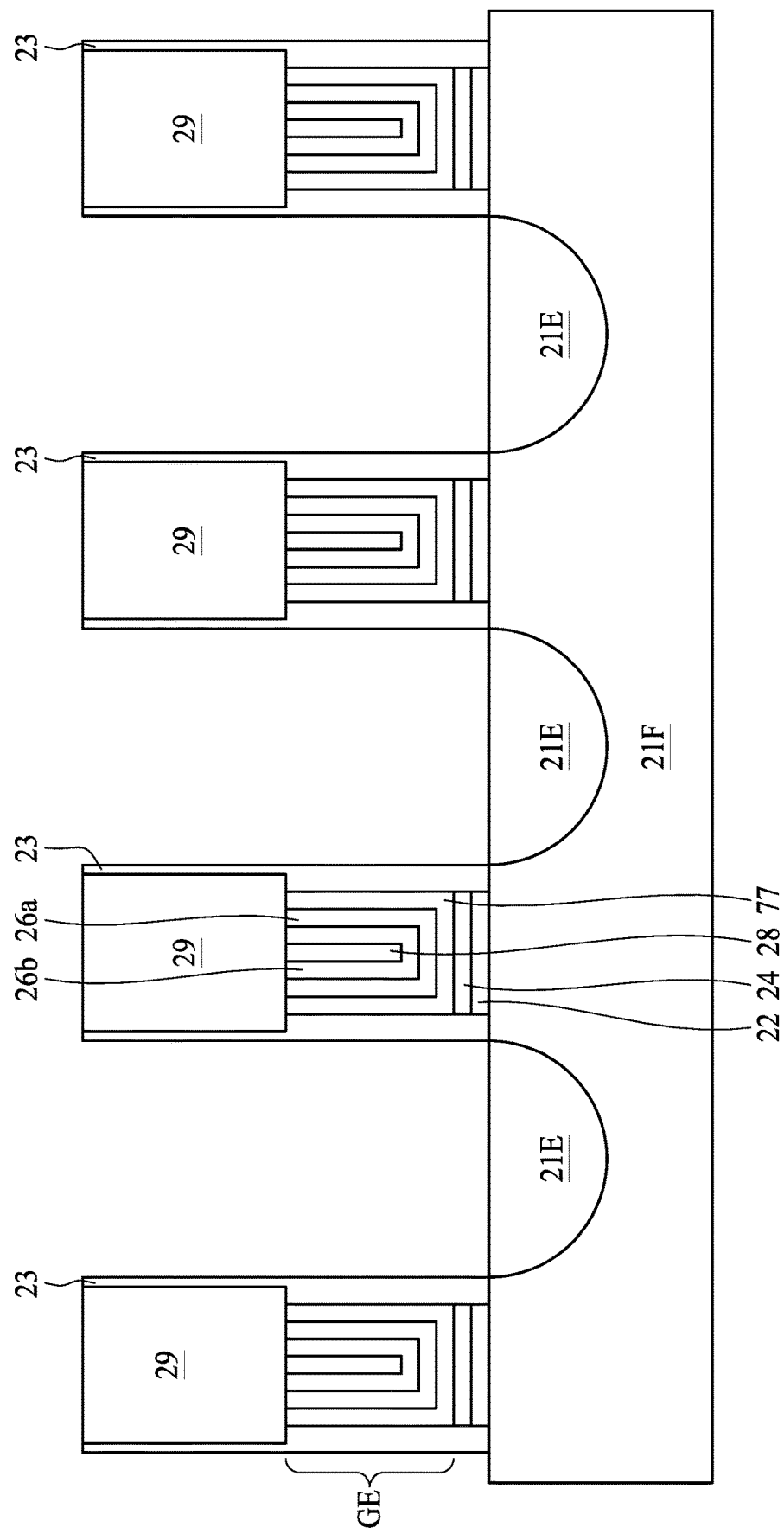

Referring to FIG. 11F, FIG. 11F is a cross sectional view of a semiconductor structure during intermediate stages of manufacturing operations, according to some embodiments of the present disclosure. The spacer layer 23 is formed to surround the gate dielectric stack 24, the gate GE and the SAC hard mask layer 29. In some embodiments, in order to expose a top surface of the fins 21F from the spacers 23, an anisotropic etching operation can be performed, wherein a vertical etching rate is greater than a lateral etching rate. A plurality of epitaxial regions 21E (which can be a doped region, such as source/drain region) is formed at a top surface 21T of the fin 21F. In some embodiments, in the cases of forming the epitaxial regions 21E entails forming a source/drain trench at a top surface of the fin 21F, the SAC hard mask layer 29 can be utilized as a mask in an etching operation. As shown in FIG. 11F, the spacer layer 23 then deposited is in contact with sidewalls of the gate dielectric stack 24, the gate GE, and the SAC hard mask layer 29. In some embodiments, the portion of the spacer layer 23 surrounding the SAC hard mask layer 29 is thinner than that surrounding the gate dielectric stack 24 and the gate GE.

Figure 11G:
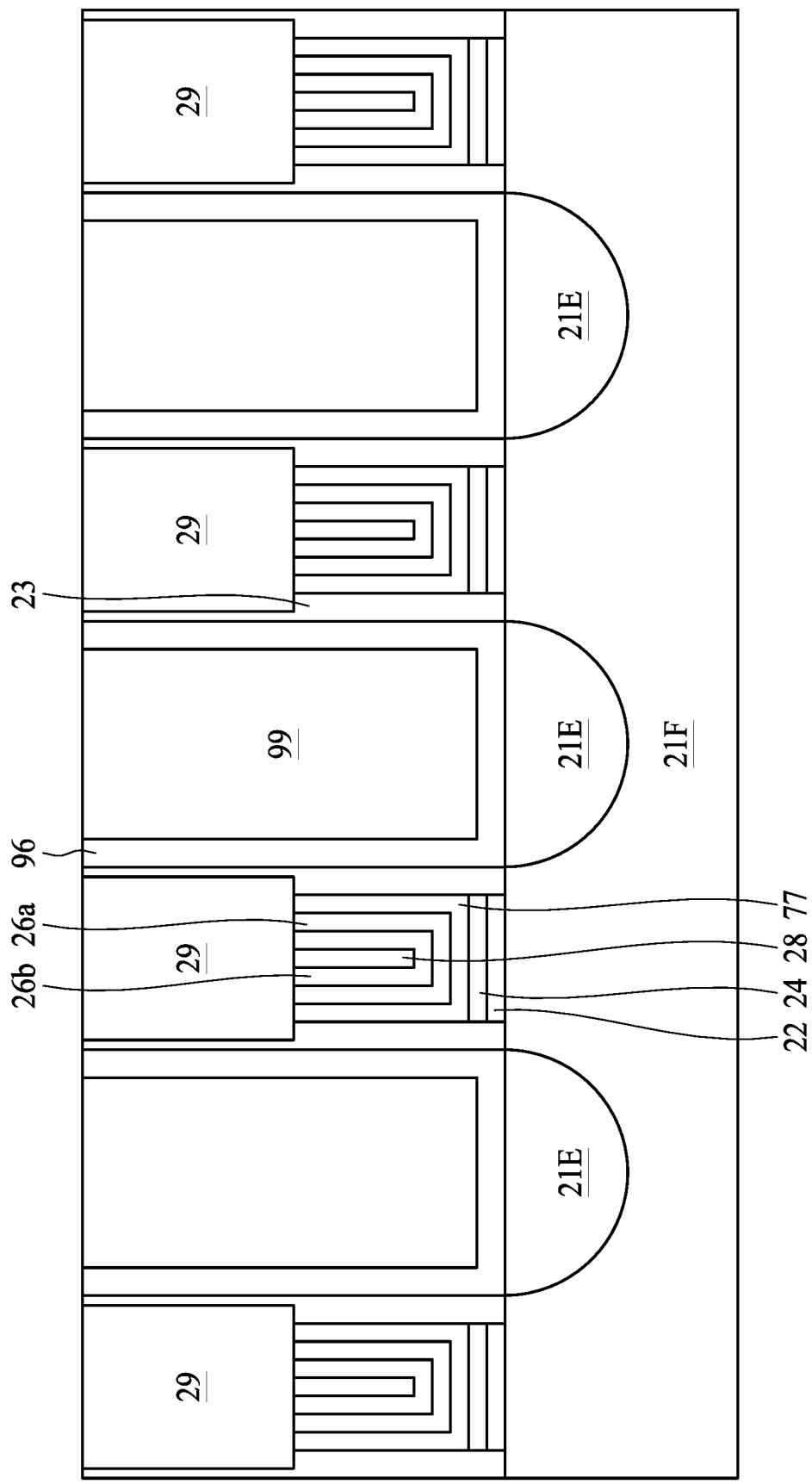

Referring to FIG. 11G, FIG. 11G is a cross sectional view of a semiconductor structure during intermediate stages of manufacturing operations, according to some embodiments of the present disclosure. The self-aligned silicide layer 96 is formed over the epitaxial regions 21E and in openings TAE (shown in FIG. 11E) exposed from the spacer 23 and the SAC hard mask layer 29. In some of the embodiments, a portion of the self-aligned silicide layer 96 may be on a sidewall of the spacer 23. A rapid thermal anneal (RTA) can be performed to anneal the self-aligned silicide layer 96. The contact plugs 99 can be formed over the epitaxial regions 21E in the openings TAE. In some embodiments, the contact plugs 99 may include conductive materials. During the operations of forming the contact plugs 99 a CMP operation may be performed to remove excessive portions.

The present disclosure provide a semiconductor device and a method for forming a semiconductor structure that utilize the coupling effect by incorporating at least one ferroelectric later 4 coupled with at least one dielectric layer 5. By utilizing the coupling effect, the aforesaid gate dielectric stacks STK_1, STK_2, STK_3, STK_4, STK_5 discussed in FIG. 1A to FIG. 1E, FIG. 2B to FIG. 3B may have enhanced dielectric constant and allowing the device to alleviate leakage voltage and/or decrease EOT while allowing the potential of scaling to smaller node technology. Furthermore, increasing the ferroelectricity of the gate dielectric stacks STK_1, STK_2, STK_3, STK_4, STK_5 may enhance coupling effect, wherein the enhancement may include performing doping operation and/or thermal annealing operations discussed in FIG. 7A, FIG. 7B, and/or FIG. 11B.

The present disclosure further provides method that improves the compatibility of incorporating the gate dielectric stacks STK_1, STK_2, STK_3, STK_4, STK_5 having a ferroelectric layer 4 (e.g. the gate dielectric stack 14 discussed in FIG. 4A to FIG. 8B or the gate dielectric stack 24 discussed in FIG. 9A to FIG. 11G) into the semiconductor devices such as FinFET, planar transistors, various types of transistors and semiconductor devices. Specifically, a property the gate dielectric stack 14 (as discussed in FIG. 4A to FIG. 8B) or the gate dielectric stack 24 (as discussed in FIG. 9A to FIG. 11G) can be utilized during forming a profile of the gate 16/GE.

Some embodiments of the present disclosure provide a semiconductor device, including a substrate, a fin over the substrate, a multilayer gate dielectric stack over the fin, wherein the multilayer gate dielectric stack includes a first ferroelectric layer, and a first dielectric layer coupled to the first ferroelectric layer, and a gate over the multilayer gate dielectric stack.

Some embodiments of the present disclosure provide a method for forming a semiconductor structure, including forming a fin over a substrate, forming a multilayer gate dielectric stack over the fin, wherein the multilayer gate dielectric stack comprises a first ferroelectric layer and a first dielectric layer coupled to the first ferroelectric layer, and forming a gate over the multilayer gate dielectric stack.

Some embodiments of the present disclosure provide a method for forming a semiconductor structure, including forming a fin over a substrate, forming a plurality of mandrels over the fin, forming a multilayer gate dielectric stack over a surface of the fin exposed from the mandrels, wherein the multilayer gate dielectric stack comprises a first ferroelectric layer and a first dielectric layer coupled to the first ferroelectric layer, forming a gate surrounded by the multilayer gate dielectric stack; and removing the mandrels.

The foregoing outlines features of several embodiments so that those skilled in the art may better understand the aspects of the present disclosure. Those skilled in the art should appreciate that they may readily use the present disclosure as a basis for designing or modifying other operations and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor device, comprising:
   a substrate;
   a fin over the substrate;
   a multilayer gate dielectric stack over the fin, wherein the multilayer gate dielectric stack comprises:
      a first ferroelectric layer; and
      a first dielectric layer coupled to the first ferroelectric layer, wherein a portion of the first dielectric layer is in direct contact with the first ferroelectric layer, the first ferroelectric layer comprises:
         a first portion made of a ferroelectric material in orthorhombic phase;
         a second portion made of the ferroelectric material in monoclinic phase; and
         a third portion made of the ferroelectric material in tetragonal phase, wherein a total volume of the second portion is greater than a total volume of the first portion, and the total volume of the first portion is greater than a total volume of the third portion; and
   a gate over the multilayer gate dielectric stack.

2. The semiconductor device of claim 1, wherein the first dielectric layer is spacing between the first ferroelectric layer and the substrate.

3. The semiconductor device of claim 1, wherein the first ferroelectric layer is spacing between the first dielectric layer and the substrate.

4. The semiconductor device of claim 1, wherein the multilayer gate dielectric stack further comprises a second ferroelectric layer between the first ferroelectric layer and the gate.

5. The semiconductor device of claim 1, wherein the first ferroelectric layer covers a sidewall of the fin.

6. The semiconductor device of claim 1, further comprising a spacer at least partially surrounding the multilayer gate dielectric stack.

7. The semiconductor device of claim 1, wherein the first ferroelectric layer material comprises crystalized grain.

8. The semiconductor device of claim 6, further comprising a capping layer over the gate and at least partially surrounded by the spacer laterally.

9. A method for forming a semiconductor structure, comprising:
forming a fin over a substrate;
forming a multilayer gate dielectric stack over the fin, wherein the multilayer gate dielectric stack comprises a first ferroelectric layer and a first dielectric layer coupled to the first ferroelectric layer, wherein forming the multilayer gate dielectric stack comprises:
forming a ferroelectric material;
performing an annealing operation to convert the ferroelectric material from an amorphous state to the first ferroelectric layer having a crystalized state, wherein the ferroelectric layer comprises a first portion with orthorhombic phase, a second portion with monoclinic phase, and a third portion with tetragonal phase, wherein a total volume of the first portion is less than a total volume of the second portion, and the total volume of the first portion is greater than a total volume of the third portion; and
forming a gate over the multilayer gate dielectric stack.

10. The method of claim 9, further comprising:
forming a dummy gate over the fin;
forming a spacer at least partially surrounding the dummy gate laterally; and
removing the dummy gate prior to forming the multilayer gate dielectric stack.

11. The method of claim 9, wherein forming the multilayer gate dielectric stack further comprising:
annealing the first dielectric layer and the first ferroelectric layer simultaneously.

12. The method of claim 9, further comprising performing a planarization operation over the gate to expose a top surface of the multilayer gate dielectric stack.

13. The method of claim 9, wherein forming the multilayer gate dielectric stack further comprising forming the first dielectric layer over the first ferroelectric layer and a second ferroelectric layer over the first dielectric layer.

14. A method for forming a semiconductor structure, comprising:
forming a fin over a substrate;
forming a plurality of mandrels over the fin;
forming a multilayer gate dielectric stack over a surface of the fin exposed from the mandrels, wherein the multilayer gate dielectric stack comprises a first ferroelectric layer and a first dielectric layer coupled to the first ferroelectric layer, wherein the first ferroelectric layer comprises a first portion with orthorhombic phase, a second portion with monoclinic phase, and a third portion with tetragonal phase, wherein a total volume of the first portion is less than a total volume of the second portion, and the total volume of the first portion is greater than a total volume of the third portion;
forming a gate between two portions of the multilayer gate dielectric stack;
partially removing an upper portion of the gate, thereby an uppermost surface of the gate is lower than an uppermost surface of the mandrels; and
removing the mandrels.

15. The method of claim 14, wherein forming the multilayer gate dielectric stack further comprising forming a second ferroelectric layer over the first dielectric layer.

16. The method of claim 14, further comprising
partially removing an upper portion of the multilayer gate dielectric stack; and
forming a hard mask layer over the gate and the multilayer gate dielectric stack.

17. The method of claim 14, further comprising annealing the multilayer gate dielectric stack to convert a portion of the first ferroelectric layer to a crystalized phase.

18. The method of claim 14, wherein a portion of the multilayer gate dielectric stack is removed during the removal of the mandrels.

19. The method of claim 14, wherein the multilayer gate dielectric stack is formed to cover each sidewall of the plurality of mandrels.

20. The method of claim 14, wherein the first ferroelectric layer comprises a first portion with orthorhombic phase, a second portion with monoclinic phase, and a third portion with tetragonal phase, wherein a total volume of the first portion is less than a total volume of the second portion, and the total volume of the first portion is greater than a total volume of the third portion.

* * * * *